(12) United States Patent
Ward

(10) Patent No.: US 7,612,582 B2
(45) Date of Patent: Nov. 3, 2009

(54) PROGRAMMABLE LOGIC CONTROLLER AND RELATED ELECTRONIC DEVICES

(76) Inventor: Derek Ward, 11 Tui Vale Road, Cockle Bay, Howick, Auckland (NZ)

( * ) Notice: Subject to any disclaimer, the term of this patent is extended or adjusted under 35 U.S.C. 154(b) by 225 days.

(21) Appl. No.: 11/896,699

(22) Filed: Sep. 5, 2007

(65) Prior Publication Data

US 2008/0058962 A1    Mar. 6, 2008

Related U.S. Application Data

(63) Continuation of application No. 11/218,721, filed on Sep. 6, 2005, now abandoned.

(30) Foreign Application Priority Data

| Sep. 3, 2004 | (NZ) | ..................................... 535130 |
| Oct. 4, 2004 | (NZ) | ..................................... 535757 |
| Dec. 24, 2004 | (NZ) | ..................................... 537536 |

(51) Int. Cl.
*H03K 19/173* (2006.01)

(52) U.S. Cl. ........................................ 326/38; 326/41

(58) Field of Classification Search ............. 326/37–41, 326/47, 101
See application file for complete search history.

(56) References Cited

U.S. PATENT DOCUMENTS

| 4,117,317 A | 9/1978 | Dooley, Jr. et al. .......... 235/307 |
| 4,275,455 A | 6/1981 | Bartlett ....................... 364/900 |
| 4,303,990 A | 12/1981 | Seipp ......................... 364/900 |
| 4,802,116 A | 1/1989 | Ward et al. .................. 364/900 |
| 4,845,627 A | 7/1989 | Nadolski et al. ............ 364/468 |
| 5,057,994 A | 10/1991 | Spiller ........................ 364/184 |
| 5,166,604 A | 11/1992 | Ahanin et al. ................ 324/158 |
| 5,369,314 A | 11/1994 | Patel ............................ 326/13 |
| 5,498,975 A | 3/1996 | Cliff et al. .................... 326/10 |
| 5,528,169 A | 6/1996 | New ............................ 326/40 |
| 5,550,843 A | 8/1996 | Yee ........................... 371/22.3 |
| 5,555,214 A | 9/1996 | Sung et al. .................. 365/221 |
| 5,583,450 A | 12/1996 | Trimberger et al. ........... 326/41 |
| 5,590,305 A | 12/1996 | Terrill et al. ................ 395/430 |
| 5,600,263 A | 2/1997 | Trimberger et al. ........... 326/39 |
| 5,617,327 A | 4/1997 | Duncan ..................... 364/489 |

(Continued)

FOREIGN PATENT DOCUMENTS

| EP | 1 233 341 | 8/2002 |
| GB | 2 371 633 | 7/2002 |

*Primary Examiner*—James Cho
(74) *Attorney, Agent, or Firm*—Jacobson Holman PLLC

(57) ABSTRACT

A programmable device is useful for high speed operation or as a process controller or as a component for implementing PLD or FPGA applications. The programmable device includes programmable logic hardware having a plurality of basic logic elements and electrically configurable interconnections. The interconnections are configurable to interconnect the logic elements as a user control program circuit and to connect the user control program circuit to input and output interfaces. When configured, the device contains a user program circuit interfaced to a control circuit. The control circuit operates synchronously with the user program circuit. The control circuit is able to communicate with a monitoring computer to respond to commands, operate when commanded to cause the user program circuit to run, or pause, or single step, read data values from said state data storage units, and write data values to said state data storage units.

37 Claims, 16 Drawing Sheets

U.S. PATENT DOCUMENTS

| | | | |
|---|---|---|---|
| 5,617,573 A | 4/1997 | Huang et al. | 395/376 |
| 5,629,637 A | 5/1997 | Trimberger et al. | 326/93 |
| 5,650,734 A | 7/1997 | Chu et al. | 326/38 |
| 5,675,589 A | 10/1997 | Yee | 371/22.3 |
| 5,691,912 A | 11/1997 | Duncan | 364/490 |
| 5,745,734 A * | 4/1998 | Craft et al. | 716/16 |
| 5,761,483 A | 6/1998 | Trimberger | 395/500 |
| 5,764,079 A | 6/1998 | Patel et al. | 326/40 |
| 5,802,540 A | 9/1998 | Sung et al. | 711/1 |
| 5,825,662 A | 10/1998 | Trimberger | 364/491 |
| 5,838,584 A | 11/1998 | Kazarian | 364/491 |
| 5,838,954 A | 11/1998 | Trimberger | 395/500 |
| 5,844,422 A | 12/1998 | Trimberger et al. | 326/38 |
| 5,869,980 A | 2/1999 | Chu et al. | 326/38 |
| 5,870,410 A | 2/1999 | Norman et al. | 371/22.2 |
| 5,875,112 A | 2/1999 | Lee | 364/489 |
| 5,894,420 A | 4/1999 | Duncan | 364/489 |
| 5,898,628 A | 4/1999 | Mielke et al. | 365/201 |
| 5,963,565 A | 10/1999 | Rezvani et al. | 371/22.1 |
| 5,970,005 A | 10/1999 | Yin et al. | 365/201 |
| 5,978,260 A | 11/1999 | Trimberger et al. | 365/182 |
| 5,986,467 A | 11/1999 | Trimberger | 326/40 |
| 6,020,758 A | 2/2000 | Patel et al. | 326/40 |
| 6,026,481 A | 2/2000 | New et al. | 712/43 |
| 6,034,536 A | 3/2000 | McClintock et al. | 326/10 |
| 6,085,317 A | 7/2000 | Smith | 713/1 |
| 6,091,258 A | 7/2000 | McClintock et al. | 326/10 |
| 6,107,820 A | 8/2000 | Jefferson et al. | 326/38 |
| 6,107,821 A | 8/2000 | Kelem et al. | 326/38 |
| 6,128,692 A | 10/2000 | Sung et al. | 711/1 |
| 6,134,707 A | 10/2000 | Herrmann et al. | 717/5 |
| 6,157,210 A | 12/2000 | Zaveri et al. | 326/40 |
| 6,166,559 A | 12/2000 | McClintock et al. | 326/10 |
| 6,167,001 A | 12/2000 | Wu | 368/113 |
| 6,173,438 B1 | 1/2001 | Kodosky et al. | 717/1 |
| 6,178,494 B1 | 1/2001 | Casselman | 712/37 |
| 6,180,425 B1 | 1/2001 | Mielke et al. | 438/15 |
| 6,182,020 B1 | 1/2001 | Fairbanks | 702/117 |
| 6,182,247 B1 | 1/2001 | Herrmann et al. | 714/39 |
| RE37,060 E | 2/2001 | Sung et al. | 365/221 |
| 6,195,772 B1 | 2/2001 | Mielke et al. | 714/724 |
| 6,201,404 B1 | 3/2001 | Reddy et al. | 326/10 |
| 6,202,185 B1 | 3/2001 | Lee | 714/726 |
| 6,205,579 B1 | 3/2001 | Southgate | 717/11 |
| 6,212,650 B1 | 4/2001 | Guccione | 714/32 |
| 6,219,628 B1 | 4/2001 | Kodosky et al. | 703/2 |
| 6,219,785 B1 | 4/2001 | Smith | 713/1 |
| 6,222,382 B1 | 4/2001 | Jefferson et al. | 326/38 |
| 6,233,205 B1 | 5/2001 | Wells et al. | 368/118 |
| 6,239,611 B1 | 5/2001 | Matera | 326/16 |
| 6,243,304 B1 | 6/2001 | Patel et al. | 365/189 |
| 6,247,147 B1 | 6/2001 | Beenstra et al. | 714/39 |
| 6,255,848 B1 * | 7/2001 | Schultz et al. | 326/41 |
| 6,263,430 B1 | 7/2001 | Trimberger et al. | 713/1 |
| 6,286,114 B1 | 9/2001 | Veenstra et al. | 714/39 |
| 6,292,116 B1 | 9/2001 | Wang et al. | 341/100 |
| 6,311,149 B1 | 10/2001 | Ryan et al. | 703/21 |
| 6,317,860 B1 | 11/2001 | Heile | 716/5 |
| 6,337,578 B2 | 1/2002 | Jefferson et al. | 326/38 |
| 6,344,755 B1 | 2/2002 | Reddy et al. | 326/10 |
| 6,351,145 B1 | 2/2002 | Lesea | 326/41 |
| 6,389,558 B1 | 5/2002 | Herrmann et al. | 714/39 |
| 6,408,432 B1 | 6/2002 | Herrmann et al. | 717/139 |
| 6,411,124 B2 | 6/2002 | Lee et al. | 326/41 |
| 6,425,077 B1 | 7/2002 | Le et al. | 713/1 |
| 6,438,737 B1 * | 8/2002 | Morelli et al. | 716/16 |
| 6,452,459 B1 | 9/2002 | Chan et al. | 331/57 |
| 6,453,456 B1 | 9/2002 | Price | 716/16 |
| 6,460,148 B2 | 10/2002 | Veenstra et al. | 714/39 |
| 6,463,339 B1 | 10/2002 | Vasko | 700/18 |
| 6,481,000 B1 | 11/2002 | Zaveri et al. | 716/17 |
| 6,484,298 B1 | 11/2002 | Nag et al. | 716/6 |
| 6,487,709 B1 | 11/2002 | Keller et al. | 716/14 |
| 6,490,714 B1 | 12/2002 | Kurniawan et al. | 716/17 |
| 6,501,297 B1 | 12/2002 | Kong | 326/41 |
| 6,507,211 B1 | 1/2003 | Schultz et al. | 326/37 |
| 6,510,546 B1 | 1/2003 | Blodget | 716/16 |
| 6,510,548 B1 | 1/2003 | Squires | 716/16 |
| 6,525,557 B1 | 2/2003 | McManus et al. | 326/8 |
| 6,525,562 B1 | 2/2003 | Schultz et al. | 326/39 |
| 6,525,678 B1 | 2/2003 | Veenstra et al. | 341/55 |
| 6,526,566 B1 | 2/2003 | Austin | 717/109 |
| 6,538,469 B1 | 3/2003 | Nguyen et al. | 326/40 |
| 6,539,508 B1 | 3/2003 | Patrie et al. | 714/726 |
| 6,539,510 B1 | 3/2003 | St. Pierre, Jr. | 714/727 |
| 6,539,534 B1 | 3/2003 | Bennett | 716/17 |
| 6,557,156 B1 | 4/2003 | Guccione | 716/17 |
| 6,584,601 B1 | 6/2003 | Kodosky et al. | 716/4 |
| 6,601,221 B1 | 7/2003 | Fairbanks | 716/5 |
| 6,608,638 B1 | 8/2003 | Kodosky et al. | 345/771 |
| 6,618,686 B2 | 9/2003 | Allamsetty | 702/120 |
| 6,625,787 B1 | 9/2003 | Baxter et al. | 716/6 |
| 6,625,795 B1 | 9/2003 | Anderson et al. | 716/16 |
| 6,625,797 B1 | 9/2003 | Edwards et al. | 716/18 |
| 6,629,311 B1 | 9/2003 | Turner et al. | 716/17 |
| 6,631,508 B1 | 10/2003 | Williams | 716/8 |
| 6,636,936 B2 | 10/2003 | Terrill et al. | 711/103 |
| 6,658,564 B1 | 12/2003 | Smith et al. | 713/100 |
| 6,668,237 B1 | 12/2003 | Guccione et al. | 702/119 |
| 6,675,310 B1 | 1/2004 | Bloom et al. | 713/500 |
| 6,691,267 B1 | 2/2004 | Nguyen et al. | 714/725 |
| 6,704,889 B2 | 3/2004 | Veenstra et al. | 714/39 |
| 6,711,674 B1 | 3/2004 | Burnham | 713/1 |
| 6,714,040 B1 | 3/2004 | Jacobson et al. | 326/38 |
| 6,714,044 B1 | 3/2004 | Rangan et al. | 326/40 |
| 6,715,139 B1 | 3/2004 | Kodosky et al. | 717/125 |
| 6,720,793 B1 | 4/2004 | Trimberger | 326/9 |
| 6,732,263 B1 | 5/2004 | May et al. | 713/1 |
| 6,732,309 B1 | 5/2004 | Toutounchie et al. | 714/725 |
| 6,732,348 B1 | 5/2004 | Tahoori et al. | 716/16 |
| 6,734,703 B1 | 5/2004 | Alfke et al. | 326/38 |
| 6,738,962 B1 | 5/2004 | Flaherty et al. | 716/17 |
| 6,748,368 B1 | 6/2004 | Trimberger et al. | 705/500 |
| 6,751,751 B1 | 6/2004 | Murray et al. | 714/34 |
| 6,754,862 B1 | 6/2004 | Hoyer et al. | 714/725 |
| 6,754,878 B1 | 6/2004 | Stentz et al. | 716/7 |
| 6,754,882 B1 | 6/2004 | Sanchez et al. | 716/16 |
| 6,760,898 B1 | 7/2004 | Sanchez et al. | 716/16 |
| 6,766,505 B1 | 7/2004 | Rangan et al. | 716/16 |
| 6,784,903 B2 | 8/2004 | Kodosky et al. | 345/771 |
| 6,802,026 B1 | 10/2004 | Patterson et al. | 714/35 |
| 6,802,053 B1 | 10/2004 | Dye et al. | 717/113 |
| 6,807,631 B2 | 10/2004 | Fuller, III | 713/100 |
| 6,812,731 B1 | 11/2004 | Trimberger | 326/10 |
| 6,817,006 B1 | 11/2004 | Wells et al. | 716/16 |
| 6,823,283 B2 | 11/2004 | Steger et al. | 702/127 |
| 6,826,717 B1 | 11/2004 | Draper et al. | 714/39 |
| 6,839,874 B1 | 1/2005 | Fang | 714/738 |
| 6,842,034 B1 | 1/2005 | Chan et al. | 326/8 |
| 6,842,039 B1 | 1/2005 | Guzman et al. | 326/38 |
| 6,857,092 B1 | 2/2005 | Fox | 714/733 |
| 6,862,724 B1 | 3/2005 | Riley et al. | 716/17 |
| 6,871,331 B1 | 3/2005 | Bloom et al. | 716/4 |
| 6,877,150 B1 | 4/2005 | Miller et al. | 716/18 |
| 2002/0099455 A1 | 7/2002 | Ward | 700/83 |

* cited by examiner

```
library IEEE;
use IEEE.STD_LOGIC_1164.ALL;

-- User Program Manager State Machine
-- Copyright (C) Derek Ward, 2004
ENTITY UPM IS
  PORT (
          Break,
          RunModeHalted,
          SingleCycle,
          DisableOpsInPauseMode,
          RequestMonitor,
          Clock,
          Clear,
          CommandWaiting     : IN STD_LOGIC;

UPCEnable,
          PreloadEnable,
          HaltRunMode,
          ShiftChainEnable,
          PauseModeOpDisable,
          MonitorServiceRunning,
          PostRunClockEnable : OUT STD_LOGIC;

CurrentState : OUT STD_LOGIC_VECTOR(3 downto 0)
        );
END UPM;

ARCHITECTURE Behavioral OF UPM IS
TYPE STATE_TYPE IS
       (
         InitState,
         WaitForCommand,
         Preload,
         RunState,
         PauseState
       );
SIGNAL State   : STATE_TYPE := InitState;
BEGIN
  PROCESS (Clock)
  BEGIN
    IF (Clock'EVENT AND Clock = '1') THEN
      IF Clear = '1' THEN
        State <= InitState;
        ShiftChainEnable <= '0';
        PauseModeOpDisable <= '0';
        MonitorServiceRunning <= '0';
        PostRunClockEnable <= '0';
      ELSE
        CASE State IS
          WHEN InitState =>
            ShiftChainEnable <= '0';
            PauseModeOpDisable <= '0';
            MonitorServiceRunning <= '0';
            PostRunClockEnable <= '0';
            IF RequestMonitor = '1' THEN
              MonitorServiceRunning <= '1';
              State <= WaitForCommand;
              -- Wait until the MC wants Monitor service,
              -- accept, and go to await command completion
            END IF;
```

FIGURE 4 – PART 1 OF 3

```
--Determine Command and start it
WHEN WaitForCommand =>
  PostRunClockEnable <= '0';
  IF CommandWaiting = '1' THEN
    -- Insert States for command servicing below.
    -- Do command and return to this state
    -- ShiftChainEnable is used in command servicing states
  ELSIF RequestMonitor = '0' THEN
    -- if command servicing done and released
    MonitorServiceRunning <= '0';
    State <= Preload;
  END IF;

WHEN Preload =>
  IF RunModeHalted = '1' THEN --
    State <= PauseState;
    IF DisableOpsInPauseMode = '1' THEN
      PauseModeOpDisable <= '1';
    ELSE
      PauseModeOpDisable <= '0';
    END IF;
  ELSE
    State <= RunState;
    PauseModeOpDisable <= '0';
  END IF;

WHEN RunState =>
  -- Run the program scan.
  IF Break = '1' OR SingleCycle = '1' THEN
    -- set HaltRunMode and reset SingleCycle
    -- in Control Register
    PostRunClockEnable <= '1';
    State <= PauseState;
    IF DisableOpsInPauseMode = '1' THEN
      PauseModeOpDisable <= '1';
    ELSE
      PauseModeOpDisable <= '0';
    END IF;
  ELSE
    IF RequestMonitor = '1' THEN
      -- if the PC wants a monitor scan, accept
      -- and go to await completion
      PostRunClockEnable <= '1';
      MonitorServiceRunning <= '1';
      State <= WaitForCommand;
    END IF;
  END IF;

WHEN PauseState =>
  -- terminate 'Set HaltRunMode and Reset SingleCycle' pulse
  PostRunClockEnable <= '0';
  IF RequestMonitor = '1' THEN
    MonitorServiceRunning <= '1';
    State <= WaitForCommand;
  END IF;

END CASE;
  END IF;
 END IF;
END PROCESS;
```

FIGURE 4 – PART 2 OF 3

```
PROCESS (State,SingleCycle)
BEGIN
-- Generate non-registered outputs
  CASE State IS
      WHEN InitState =>
          PreloadEnable <= '0';
          HaltRunMode <= '1';
                          -- to stop RunState until monitor says run.
          UPCEnable <= '0';
          CurrentState      <= "0000";
      WHEN WaitForCommand =>
          PreloadEnable <= '0';
          HaltRunMode <= '0';
          UPCEnable <= '0';
          CurrentState      <= "0001";
      WHEN Preload =>
          PreloadEnable <= '1';
          HaltRunMode <= '0';
          UPCEnable <= '0';
          CurrentState      <= "0010";
      WHEN RunState =>
          PreloadEnable <= '0';
          IF SingleCycle = '1' THEN
             HaltRunMode <= '1';
          ELSE
             HaltRunMode <= '0';
          END IF;
          UPCEnable <= '1';
          CurrentState      <= "0011";
      WHEN PauseState =>
          PreloadEnable <= '0';
          HaltRunMode <= '1';
          UPCEnable <= '0';
          CurrentState      <= "0100";
   END CASE;
  END PROCESS;

END Behavioral;
```

FIGURE 4 – PART 3 OF 3

PROGRAMMABLE LOGIC CONTROLLER AND RELATED ELECTRONIC DEVICES

This is a continuation of U.S. Ser. No. 11/218,721 filed Sep. 6, 2005, now abandoned.

BACKGROUND TO THE INVENTION

1. Field of the Invention

The present invention relates to programmable devices and related electronic devices.

2. Summary of the Prior Art

In our previous patent, exemplified by GB 2371633 published 31 Jul. 2002, I described methods and means that enabled the design of a programmable controller to be based on programmable logic device technology and in which the user program is implemented as a physical circuit in a programmable logic device. Some particular advantages of such a design are those of high speed operation of the user program and flexibility in terms of the functionality that the user may select to include in their program. Such functionality being for instance the type that a microprocessor based programmable controller would provide in the form of add-on dedicated hardware; for example, multiple fast counters, positioning servos or motor controllers. A microprocessor based programmable controller does not have the processor power to support such functionality directly, but the programmable logic device programmable controller can do so because it configures its circuits as required in real physical logic.

This application describes further improvements and adaptations related to the use of programmable logic device based programmable controller technology for control of fast electronic and electrical circuits and for developing the program circuits that are configured in the programmable logic devices used.

Definitions

| | |
|---|---|
| programmable logic device (PLD) | The term is used in two ways, firstly as a term describing a type or class of electronic device, and secondly when referred to in definite terms (using "the" or similar), it is used to distinguish the component used in our invention to implement the user program circuit from other components in the invention. In the first sense, the term programmable logic device (PLD) is used to mean any electronic device or system capable of having a circuit configuration loaded into it and thereby being user programmed with a logic circuit implemented and operating as a physical circuit. Our usage of the term programmable logic device (PLD) is broader than general industry usage, but does not include computer software emulation of a circuit, or assembly of a circuit by physically placing and connecting components. |
| PLDPC | A Programmable Logic Device Programmable Controller. Particularly a programmable controller of the general type described in GB 2371633 and used for either controlling plant, machinery, electrical or electronic equipment, or as a design, development and debugging platform for utilizing PLDs such as FPGAs or CPLDs. |
| FPGA | Field Programmable Gate Array. A type of programmable logic device (PLD). An FPGA is used to provide the programmable logic device (PLD) in the preferred embodiment. |
| CPLD | Complex Programmable Logic Device A type of programmable logic device (PLD). Reference can be made to CPLDs and FPGAs from Xilinx, Inc* and other manufacturers to clarify the nature of the devices. Examples of applicable devices are Xilinx XC2C256 and XC2S200E devices respectively. |
| flash memory (FM) | A memory device that retains its data when power is lost. |
| monitoring computer (MC) | The computer or other device by which the user controls the PLDPC. |
| communications circuit (CC) | Microprocessor or other circuit that facilitates communications between the monitoring computer (MC) and PLDPC. |
| phase locked loop (PLL) | A circuit used in the synthesis and synchronization of signals of a particular frequency. |
| voltage monitor and reset generator (VMRG) | A standard device that generates system reset levels dependent on the level of the supply voltage. |
| I/O | Input/Output. Particularly relating to signals or connections to a device or circuit from other external devices or circuits. |
| user program framework (UPF) | Special circuits normally automatically combined with the user program circuit by the PLDPC software and configured in the programmable logic device (PLD) to support the data access and control functions of the software. Under some circumstances, the user program framework (UPF) may also be implemented outside of the programmable logic device (PLD) and suitably interfaced to it. |
| configuration bit pattern (CBP) | A series of '1's and '0's as used to configure a FPGA or CPLD or other programmable logic device (PLD). |
| user program circuit (UPC) | The circuit defined by the user as a way of specifying the functionality required of the programmed PLDPC, generally entered in schematic form, but may be entered in other forms such as a netlist, a ladder diagram, a Hardware Description Language listing, etc., if so desired. The user program circuit (UPC) is combined with the user program framework (UPF) and translated into a configuration bit pattern (CBP) that is used to configure the programmable logic device (PLD). The user program circuit (UPC) can be thought of and referred to as both a circuit and a program. The user program framework (UPF) is not considered to be part of the user program circuit (UPC). In GB 2371633 a user program circuit (UPC) is referred to as a Logic Processing Circuit or LPC. |
| forcing | Forcing is a standard term used with machine control programmable controllers, and means the holding of a signal at a defined level even when normal circuit operation is attempting to drive the signal to a different value. |
| RAM | Random Access Memory. |
| shift chain | GB 2371633 teaches methods of reading and writing state data contained within a user program circuit (UPC). One method is to have the flip-flops used in the user program circuit (UPC) switched into the form of a shift register, or shift chain, accessible to the monitoring computer (MC) during the data access interval. Other methods are also discussed. In this document we will use the term "shift chain" to refer to all of the methods previously taught unless the context precludes such general use. |
| indirectly accessible device (IAD) | A device, such as a RAM, whose flip-flops cannot be linked directly into the shift chain, but that can have an interface circuit linked into the shift chain added to it to access its data or interface transactions. |
| fixed support circuit (FSC) | Fixed circuitry providing support functions for the PLDPC operation. |
| fixed circuitry | Circuits of a fixed configuration independent of the usage of the PLDPC as opposed to circuits configured using programmable logic techniques during operation of the PLDPC. |

-continued

| | |
|---|---|
| user program manager (UPM) | A state machine in the user program framework (UPF) that controls the activities and operation of the user program circuit (UPC). |
| logic processing interval (LPI) | The slice of time during which the user program circuit (UPC) operates as the circuit specified by the user. |
| data access interval (DAI) | The slice of time during which the user program circuit (UPC) exchanges state data with the monitoring computer (MC). |
| active clock transition (ACT) | A transition in a clock pulse waveform that causes a flip-flop to sample its inputs and change state as appropriate. The active clock transitions (ACTs) referred to in this specification are always the positive going edges, but the invention could equally well be implemented using negative edge clocking. |
| active transition interval (ATI) | The interval between any one active clock transition (ACT) and the next. |
| peripheral circuits | The circuits external to and being controlled by the PLDPC. |
| monitor-able flip-flop (MFF) | A flip-flop used in the user program circuit (UPC) that can be monitored by a monitoring computer (MC). |
| user circuit enable (UCE) | Signal used to enable monitorable flip-flops (MFFs) to function as user program circuit (UPC) flip-flops during logic processing intervals (LPIs). |
| shift chain enable (SCE) | Signal used to enable monitorable flip-flops (MFFs) to function as Shift Chain flip-flops during data access intervals (DAIs). |
| tap clock enable (TCE) | Signal used to enable a flip-flop to sample and store the value of a user circuit signal as it exists after the last enabled clock pulse in a logic processing interval (LPI), and before the next data access interval (DAI), hence enabling the monitoring computer to determine the current value of the signal. The word "tap" is derived from the name of a Signal Tap component in the user library. |
| latching | In this specification, the term "latching" means the sampling and storing of an input value on a clock edge by an edge triggered flip-flop, and does not refer to the transmission of a value while the clock is at one value, and the holding of the value while the clock is at the other value. |
| UPC component library | The library of components supplied with the PLDPC for use in designing user program circuits (UPCs). The components use monitorable flip-flops (MFFs) so that the monitoring computer (MC) may read and write the user program circuit (UPC) state data. They may appear to the user as schematic symbols, or in some other suitable form. |
| preload buffer | A test component, available in the user program circuit (UPC) component library that enables the user to control the state of any particular signal at the start of the settling period prior to the first active clock transition (ACT) in each logic processing interval (LPI), and used for a single step test. |
| HMI | Human-Machine Interface. An industry standard term |
| SCADA | Supervisory Control and Data Acquisition. An industry standard term |

*All trademarks are acknowledged as the property of their respective owners.

SUMMARY OF THE INVENTION

It is an object of the present invention to provide improvements and/or adaptations related to the use of programmable logic device based programmable controller technology for control of fast electronic and electrical circuits and/or for developing the program circuits that are configured in the programmable logic devices used.

In a first aspect the invention consists in a programmable device useful for high speed operation or as a process controller, for which the item under control may consist of plant, machinery, peripheral electrical or electronic circuits or other automated systems, or useful as a component for implementing PLD or FPGA applications, said programmable device including:

at least one input interface and an input register for connection to the item under control to provide sampled and stored input data in digital form, at least one output interface and an output register for connection to the item under control to receive and store output data in digital form, programmable logic hardware including a plurality of basic logic elements and electrically configurable interconnections, said interconnections configurable to interconnect the logic elements as a user control program circuit and to connect the user control program circuit to said input and output interfaces, program loading means enabling the user to configure the programmable logic hardware with a user program circuit prior to commencing control, said user program circuit having a plurality of state data storage units storing the user program circuit state data, wherein said programmable device when configured contains a user program circuit interfaced to a means of control, said means of control operating synchronously with the user program circuit, said means of control is able to:

communicate with a monitoring computer to respond to commands, operate when commanded to cause the user program circuit to run, or pause, or single step, read data values from said state data storage units, and write data values to said state data storage units.

In a further aspect the invention consists in a system including a programmable device including:

at least one input interface and an input register for connection to the item under control to provide sampled and stored input data in digital form, at least one output interface and an output register for connection to the item under control to receive and store output data in digital form, programmable logic hardware including a plurality of basic logic elements and electrically configurable interconnections, said interconnections configurable to interconnect the logic elements as a user control program circuit and to connect the user control program circuit to said input and output interfaces, program loading means enabling the user to configure the programmable logic hardware with a user program circuit prior to commencing control, said user program circuit having a plurality of state data storage units storing the user program circuit state data, wherein said programmable device when configured contains a user program circuit interfaced to a means of control, said means of control operating synchronously with the user program circuit, said means of control is able to communicate with a monitoring computer to respond to commands, said means of control is able to operate when commanded to cause the user program circuit to run, or pause, or single step, said means of control is able to read data values from said state data storage units and to write data values to said state data storage units, said means of control is able to pause the user program circuit in response to a signal originating in the user program circuit effective before the next active clock transition after that giving rise to the signal, said means of control being configured into the programmable logic hardware together with the user program circuit, and wherein said programmable device has an operating cycle of at least two non-overlapping sequential intervals, each interval consisting of one or more clock periods and during which, within a first said interval (the logic processing interval) an input data register operates to sample and store input data, and also the user program circuit operates to update its state data and allow the resultant combinational logic values to settle, and also an output data register operates to latch and store the output data, and within a second said interval (the data access interval) said means of control is enabled to read and write the user program circuit state data and cause control functions to be performed, and said programmable device includes means for selecting the programmable logic hardware clock frequency from a range of values, for the purpose of accommodating various user program circuit logic settling times; and a monitoring computer including:

means enabling the comparison of a known good reference set of user program circuit state data response patterns representing correct circuit operation with a test set of user program circuit state data response patterns, the test set representing actual circuit operation under the same circuit initial and stimulus conditions as the said reference set, but generated at a different selected clock frequency, such that differences in the patterns indicate incorrect circuit operation, means for repeating the tests and comparisons using different clock frequencies until the maximum allowable clock frequency at which the user program circuit will operate correctly has been found, said monitoring computer enabling the measurement of the maximum clock frequency at which the user program circuit will run without error.

In a still further aspect the invention consists in the monitoring computer of the system set forth above.

In a still further aspect the invention consists in a system including a programmable device including:

at least one input interface and an input register for connection to the item under control to provide sampled and stored input data in digital form, at least one output interface and an output register for connection to the item under control to receive and store output data in digital form, programmable logic hardware including a plurality of basic logic elements and electrically configurable interconnections, said interconnections configurable to interconnect the logic elements as a user control program circuit and to connect the user control program circuit to said input and output interfaces, program loading means enabling the user to configure the programmable logic hardware with a user program circuit prior to commencing control, said user program circuit having a plurality of state data storage units storing the user program circuit state data, wherein said programmable device when configured contains a user program circuit interfaced to a means of control, said means of control operating synchronously with the user program circuit, said means of control is able to communicate with a monitoring computer to respond to commands, said means of control is able to operate when commanded to cause the user program circuit to run, or pause, or single step, said means of control is able to read data values from said state data storage units and to write data values to said state data storage units, said means of control is able to pause the user program circuit in response to a signal originating in the user program circuit effective before the next active clock transition after that giving rise to the signal, said means of control being configured into the programmable logic hardware together with the user program circuit, and wherein said programmable device has an operating cycle of at least two non-overlapping sequential intervals, each interval consisting of one or more clock periods and during which, within a first said interval (the logic processing interval) an input data register operates to sample and store input data, and also the user program circuit operates to update its state data and allow the resultant combinational logic values to settle, and also an output data register operates to latch and store the output data, and within a second said interval (the data access interval) said means of control is enabled to read and write the user program circuit state data and cause control functions to be performed, and means for detecting transitions on selected signals within the user program circuit including:

means for selectively performing, for each selected signal, at least one of:

enabling or disabling the detection of transitions on the signal, reading the existing level of the signal, selecting the polarity of the transition to be detected, positive going, negative going or both, that will generate a trigger, and detecting whether a trigger condition has occurred during the last operational clock cycle; and means for allowing settings of the means for detecting transitions, for each selected signal, to be changed by the monitoring computer during a data access interval while the user program circuit continues to operate multi-tasked; and a monitoring computer including:

means for displaying one or more user program circuit selected signal waveforms without polling a shift chain, for each waveform said means for displaying being driven by transitions occurring on the signal, said waveform being defined by the initial waveform level and the cycle counts at which the transitions occur.

In a still further aspect the invention consists in the monitoring computer of the system set forth above.

In a still further aspect the invention consists in a system including a programmable device including:

at least one input interface and an input register for connection to the item under control to provide sampled and stored input data in digital form, at least one output interface and an output register for connection to the item under control to receive and store output data in digital form, programmable logic hardware including a plurality of basic logic elements and electrically configurable interconnections, said interconnections configurable to interconnect the logic elements as a user control program circuit and to connect the user control program circuit to said input and output interfaces, program loading means enabling the user to configure the programmable logic hardware with a user program circuit prior to commencing control, said user program circuit having a plurality of state data storage units storing the user program circuit state data, wherein said programmable device when configured contains a user program circuit interfaced to a means of control, said means of control operating synchronously with the user program circuit, said means of control is able to communicate with a monitoring computer to respond to commands, said means of control is able to operate when commanded to cause the user program circuit to run, or pause, or single step, said means of control is able to read data values from said state data storage units and to write data values to said state data storage units, said means of control is able to pause the user program circuit in response to a signal originating in the user program circuit effective before the next active clock transition after that giving rise to the signal, said means of control being configured into the programmable logic hardware together with the user program circuit, and wherein said programmable device has an operating cycle of at least two non-overlapping sequential intervals, each interval consisting of one or more clock periods and during which, within a first said interval (the logic processing interval) an input data register operates to sample and store input data, and also the user program circuit operates to update its state data and allow the resultant combinational logic values to settle, and also an output data register operates to latch and store the output data, and within a second said interval (the data access interval) said means of control is enabled to read and write the user program circuit state data and cause control functions to be performed; and a monitoring computer enabling the display of user program circuit signal waveforms and optionally other data, the monitoring computer including:

means for reading user program circuit state data representing the signals and data to be displayed, means for single stepping the user program circuit, and means for repeating said reading and single stepping for the required number of clock cycles.

In a still further aspect the invention consists in the monitoring computer of the system set forth above.

In a still further aspect the invention consists in a computer programmed to generate a logic circuit for configuring into programmable logic hardware having a plurality of basic logic elements and electrically configurable interconnections, said circuit including a user program circuit having a plurality of state data storage units for storing user program state data, and a control circuit operating synchronously with the user program circuit, said control circuit being able to communicate with a monitoring computer to respond to commands, to operate when commanded to cause the user program circuit to run, or pause, or single step, and to read data values from said state data storage units and write data values to said state data storage units.

To those skilled in the art to which the invention relates, many changes in construction and widely differing embodiments and applications of the invention will suggest themselves without departing from the scope of the invention as defined in the appended claims. The disclosures and the descriptions herein are purely illustrative and are not intended to be in any sense limiting.

BRIEF DESCRIPTION OF DRAWINGS

One preferred form of the invention will now be described with reference to the accompanying drawings in which:

FIG. 4 is a listing of VHDL code for the user program manager (UPM).

PREFERRED EMBODIMENT

Figure 1:
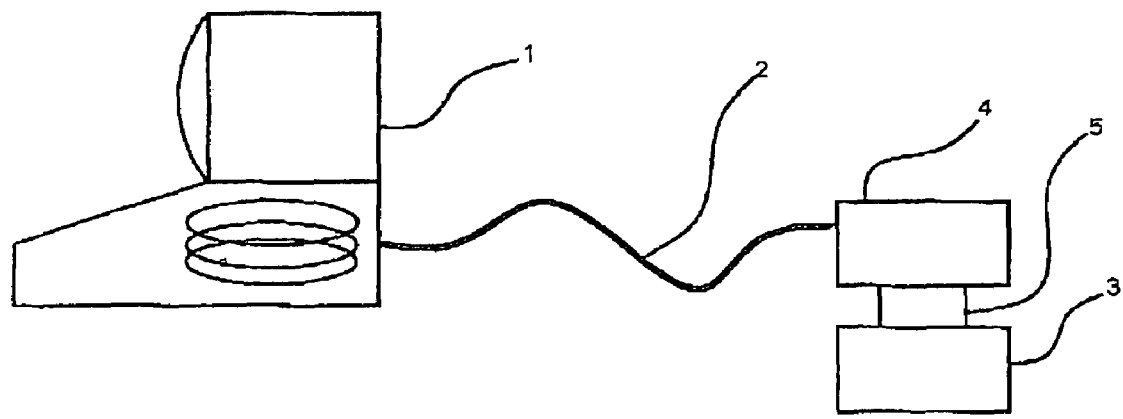
FIG. 1 is a block diagram of a monitoring computer (MC) communicating with a PLDPC.

Additional development of the PLDPC concept has demonstrated the great speed advantages of this technique. Whereas a traditional programmable controller only has a sufficient speed of response, perhaps in the millisecond region, to control plant and machinery, a PLDPC can respond in nanoseconds allowing it to be used for replacing or controlling high speed electronic circuits.

In particular, the PLDPC technology can be made fast and flexible enough to be a better choice for use in many of the electronics applications served by traditional digital logic circuits. These circuits include ones resident in programmable logic device (PLD) devices such as FPGAs and CPLDs used as part of custom designed hardware, and implemented without the benefit of the improvements as taught in the present application.

Tools Similar to Software Debugging But for Hardware

The PLDPC can be implemented using a CPLD or FPGA as the user program circuit (UPC) programmable logic device (PLD), with extra functionality added by means of software and hardware to provide access to data in, and control of, the user program circuit (UPC).

The reader skilled in the art will see that some of the improvements taught in this specification are similar to those available for debugging microprocessor software, but made available for a programmable logic device (PLD) hardware environment via the means described. I refer, for example, to the ability to single-step the user program circuit (UPC), freezing it after each step for examination of the circuit state, and the ability to implement breakpoints to trap the occurrence of error or other conditions on which it is desirable to freeze the circuit and examine the circuit state.

Alternative to Traditional Logic Design Methods

The traditional approach to using FPGAs or CPLDs involves the design engineer(s) designing the user circuit, simulating it on a computer with simulated inputs, checking the simulated responses for correctness, loading the circuit configuration into the programmable logic device (PLD) and proving its operation using hardware or software based instrumentation attached to the hardware. The hardware within which the FPGA or CPLD is mounted and which is most often custom designed, must typically provide additional facilities and components, for example to store the configuration bit pattern (CBP), provide a clock signal, filter, decouple, distribute and possibly regulate power supplies, and provide a communications channel and connections to the instrumentation. Traditional digital logic, assembled from small or medium scale integrated functions, can be even more cumbersome to design and test.

While the option of a custom simulated design will be the best solution in some applications, particularly in large volume applications with which there may be considerable cost advantages accruing in saved material costs, the PLDPC will be the best choice in many smaller volume applications where the reduction in design costs due to the additional facilities provided by the PLDPC outweigh the additional material costs. This is a similar trade-off to that which exists between the use of standard programmable controllers or custom designed controllers for machine control applications.

Requirements

Whereas the PLDPC as described in GB 2371633, because of its very high response rate, is directly applicable to replacing or controlling a proportion of electronic logic applications or circuits, it is advantageous to provide some modified or additional facilities to support the requirements of high speed electronic circuits. Some examples are the requirements to:
  minimize the number of clock pulses needed to produce any particular response.
  run at the highest clock speed possible with full assurance of error free operation.
  automatically handle issues related to setup and hold times, synchronization and metastability at the interface between the PLDPC and the peripheral circuits, all with the minimum time penalty.
  synchronize, with a minimum waste of time, with the remainder of the controlled electronics during any monitor time-slices.
  provide full monitoring at the electronics level with display, modify and control facilities, including the ability to set breakpoints, and run, pause, resume and single-step the user program circuit (UPC) in order to debug the user program circuit (UPC) operation.

Variations in Implementation

It should be noted that the detailed implementations of the invention for different user groups, while all possessing the vital elements of the invention, will vary because for instance electronic design engineers are comfortable dealing with nanosecond timing, glitches, high speed signals and other issues that arise when building circuits from basic electronic components, whereas industrial control engineers who normally use standard programmable controllers require a product designed to hide such low level electronic considerations, but are comfortable with different issues related to the plant and machinery environment.

Core Modules

It is established practice in the electronics industry for manufacturers to make sub-assemblies for sale for inclusion in other manufacturer's products. The purpose of such a sub-assembly is to provide many customers, i.e. the many manufacturers who incorporate the subassemblies, with a pre-engineered item, which, if not available, would have involved each of them separately in substantial and identical design work. Avoiding repeated design work reduces the overall costs.

One example is a Microprocessor Core Module, a subassembly of the essential parts required to make up the core of a microcomputer system, which might consist of a printed circuit board, microprocessor, memory, serial port, network connection, digital ports, etc, and software designed to make the core module easy to use. Z World Inc's Rabbit Core Module product is a Microprocessor Core Module. A Rabbit Core Module is used in the preferred embodiment of the present invention as the communications circuit (CC).

The PLDPC as a Core Module or Built-in System

The PLDPC, which is the subject of this application, may beneficially be implemented in the form of a core module, which we will term a programmable logic device (PLD) Core Module, but it should be recognized that it can be implemented in many other forms, one of which would be as a standard fast programmable logic device (PLD) based programmable controller.

Alternatively, the system as described may simply be incorporated into a user's FPGA or CPLD based circuit design and used as a way of developing the circuit for their programmable logic device (PLD). The latter approach would provide debug control over the user's user program circuit (UPC) and peripheral circuits by interrogating, displaying and forcing input signals, and forcing, displaying and enabling/disabling output signals, and generally provide full monitoring and control at run time.

SUMMARY

In summary, this invention seeks to provide a programmable controller using the general principles of operation described in GB 2371633, but particularly adapted to extending the use of the invention to controlling electronic circuits, although not limited to that application. In doing so, it uses FPGAs or CPLDs for the same applications for which they would normally be used, but seeks to make the devices easier to use and to reduce the extensive learning period required to use them via the traditional simulation method by replacing that approach with different design and debugging and commissioning methods. The PLDPC of the present invention provides an interactive method promising a much shorter learning curve that allows the user to draw a circuit schematic on a monitoring computer (MC) screen, compile and download it into a piece of standard hardware, and monitor its operation using the same schematic diagrams in a similar way to monitoring a standard programmable controller or a PLDPC used for plant and machinery control.

It is envisaged that one consequence of the new method will be that it becomes feasible to use FPGAs and CPLDs in a wider range of applications than previously, particularly small volume applications.

The preferred embodiment is now described. It should be noted that the invention has a wide range of applications and that the details of an optimal configuration will vary depending on the end-user application, and the variations will be obvious to one skilled in the art, however the preferred embodiment disclosed here is designed to be suitable for describing the novel features of the invention for which claims are made.

As the present invention consists of improvements, refinements and additions to our previous patent, it is unnecessary to describe again in detail what is already described in the previous patent, and the description here is confined to the improvements, refinements and additions, together with whatever may be of immediate help in understanding those aspects. The disclosure in my earlier patent application, as exemplified by GB 2371633 is hereby incorporated by reference.

The general arrangement within which the PLDPC as used is shown in FIG. 1. Software is provided which runs on the monitoring computer (MC) 1. The monitoring computer (MC) has a communications link 2 connecting it to the PLDPC 3. There is a communications circuit (CC) 4 at the end of the communications link that acts as part of the monitoring computer (MC) to programmable controller communications system. The monitoring computer (MC) talks to the PLDPC through the communications circuit (CC). The PLDPC itself has connectors 5 on its printed circuit board into which the communications circuit (CC) plugs. The PLDPC can function as a controller for peripheral circuits without the communications circuit (CC) and monitoring computer (MC), which are used for entering, editing, compiling, downloading, monitoring, testing and controlling user program circuits (UPCs).

Major Components of PLDPC

Figure 2:
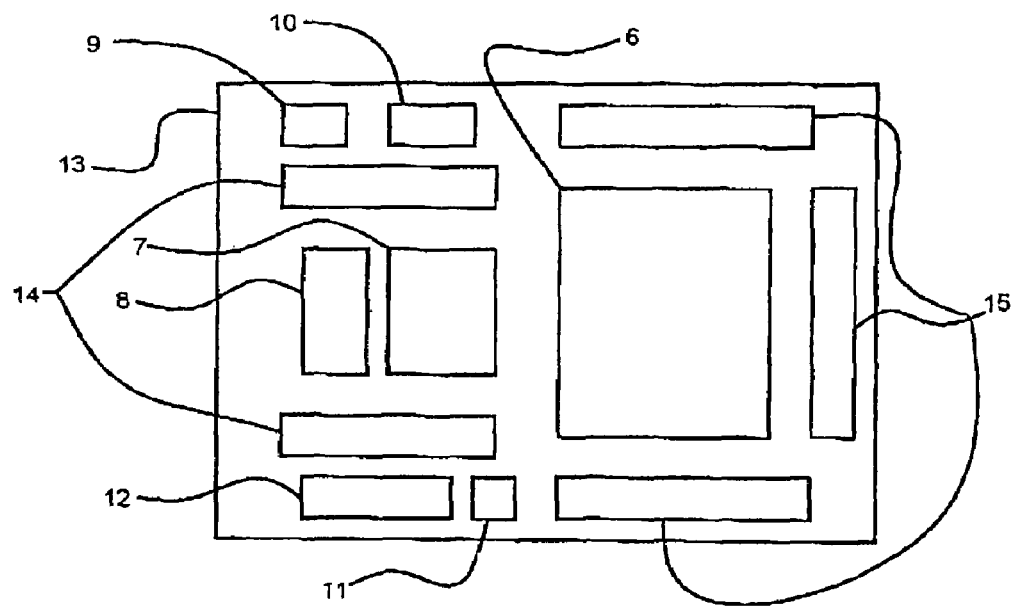
FIG. 2 is a block diagram of a PLDPC in the form of a core module.

The preferred embodiment of the PLDPC is as a core module shown in component block form in FIG. 2 and consists of a number of major components—the programmable logic device (PLD) 6, a fixed support circuit (FSC) 7, a flash memory (FM) 8, a phase locked loop (PLL) 9, a crystal oscillator 10, a voltage monitor and reset generator (VMRG) 11, and a power supply unit 12 consisting of voltage regulators, filtering and decoupling capacitors, all mounted on a printed circuit board 13 with various other minor components. Connectors 14 connect the PLDPC to the communications circuits (CC) and connectors 15 provide the PLDPC with I/O connections. Most of these items are not novel in themselves, but are listed to simplify understanding of the embodiment description.

Some aspects of the preferred embodiment are not described in detail because they are routine issues for someone skilled in the art. It is assumed that these will be implemented using established good practice.

The novelty of this invention resides in the circuits loaded into the programmable logic device (PLD) and resident in the fixed support circuit (FSC), and the way all are used to implement PLDPC functionality as described in this specification.

The functions performed are:

Flash Memory

The flash memory (FM) stores the user program circuit (UPC) and user program framework (UPF) configuration bit pattern (CBP) needed to configure the programmable logic device (PLD) to implement the user program circuit (UPC). In particular the bit pattern is stored in the flash memory (FM) so that the CPLD can automatically configure the programmable logic device (PLD) when power comes on in the absence of the communications circuits (CC) and communications to the monitoring computer (MC), or if such a requirement is indicated by, for instance, a jumper on the printed circuit board.

Once the user program circuit (UPC) has been fully developed and made operational by the user, the PLDPC Core Module can be left to run independently without the monitoring computer (MC), communications link and communications circuits (CC). So that the system can restart independently after loss of power, the flash memory (FM) can also store necessary setup data required to initialize the system on power-up, including the value of the clock frequency chosen for the programmable logic device (PLD) and optionally all necessary system state data saved when the system last lost power.

Fixed Support Circuit

The fixed support circuit (FSC) as used in the preferred embodiment is preconfigured in a CPLD, a fixed configuration (i.e. flash ROM based) logic device running at a constant clock frequency. It functions to configure the programmable logic device (PLD) and works with the communications circuits (CC) to read and write the flash memory (FM). The fixed support circuit (FSC) also contains circuits that operate with the phase locked loop (PLL) and determine the frequency of the clock supplied to the programmable logic device (PLD). It supplies and conditions the programmable logic device (PLD) reset signal.

The fixed support circuit (FSC) can optionally configure the programmable logic device (PLD) at power-up and establish necessary system values such as operating frequency, run or pause state, output enabling state, and restore system state data as per the last power-off, and so on.

The fixed support circuit (FSC) could optionally be provided as fixed circuitry built into the programmable logic device (PLD) by the programmable logic device manufacturer with at least the benefit of reducing the chip count required to implement the PLDPC.

The Programmable Logic Device

The main function of the programmable logic device (PLD) is to host the user program circuit (UPC), and to interface to the peripheral circuits via its I/O pins. These pins can handle bidirectional signals as well as unidirectional signals.

In order to provide that functionality, and to allow for the various monitoring functions that are needed, the software run on the monitoring computer (MC) may be arranged to automatically combine special circuitry, termed the user program framework (UPF) with the user program circuit (UPC). Alternatively the user program framework (UPF) can be provided as fixed circuitry built into the programmable logic device (PLD) by the programmable logic device manufacturer. The software includes a user program circuit (UPC) component library, and these components include necessary functionality to allow for the monitoring functions.

In the preferred embodiment the programmable logic device (PLD) is a FPGA.

Phase Locked Loop

The phase locked loop (PLL) is configured in a standard manner. It may be implemented using a Texas Instruments TLC2933 Phase Locked Loop integrated circuit, or similar device, together with dividers implemented in the fixed support circuit (FSC), in such a way as to generate selectable frequencies in response to values written into registers controlling the dividers.

The TLC2933 can conveniently generate a selected frequency in the range 50 to 100 MHz. Working with a 1 MHz reference, a frequency may be selected at any 2 MHz interval from 50 to 100 MHz, and division of the selected frequency by an integer power of two can generate frequencies in the ranges of 25 to 50 MHz, 12.5 to 25 MHz, etc.

Crystal Oscillator, Voltage Monitor and Reset Generator, and Power Supply Unit

The crystal oscillator, voltage monitor and reset generator (VMRG), and power supply unit are all standard components performing routine tasks.

User Program Manager

The monitoring computer (MC) is used to enter the user program circuit (UPC) via the schematic entry system of the software using a user program circuit (UPC) component library of functions implemented as described in GB 2371633, and using flip-flops that can be combined into a shift chain as also described. The software translates the schematic into a Hardware Description Language form, links each monitorable flip-flop (MFF) into the shift chain, adds the user program framework (UPF) and generates a configuration bit pattern (CBP) from it using standard programmable logic device (PLD) logic synthesis and fitting techniques. The result is a circuit which can be monitored, the flip-flops in the user program circuit (UPC) appear in a shift chain, and the functionality of each monitorable flip-flop (MFF) in the user program circuit (UPC) is known to the software. The shift chain is under the control of a state machine called the User Program Manager in the user program framework (UPF).

The purpose of the user program manager (UPM) is to switch the system between Logic Processing and Data Access modes of operation and to provide control as required to— service monitoring requests from the monitoring computer (MC), pause the user program circuit (UPC) by disabling the logic processing interval (LPI) clock pulses, resume the user program circuit (UPC) by re-enabling the logic processing interval (LPI) clock pulses, single step the user program circuit (UPC) by enabling a single logic processing interval (LPI) clock pulse, run the user program circuit (UPC) by enabling a specific number or continuous logic processing interval (LPI) clock pulses, monitor for breakpoints activated and consequently pause the user program circuit (UPC), and control the clocking of special display and test components.

It should be noted that, due to the requirement to minimize the number of clock pulses needed to produce any particular response, the user program manager (UPM) described does not sequentially firstly latch input signals, then process the user program circuit (UPC), then provide data access, then latch output values. Rather, it latches input signals, processes the user program circuit (UPC), and latches output values each and every clock pulse that the user program circuit (UPC) clocking is enabled (See the discussion of the UPCEnable signal), and provides an alternative mode of operation to service monitor requests. Control and handshaking signals accessible to the monitoring computer (MC) enable the monitoring computer (MC) to request and control the necessary data access.

Figure 3:
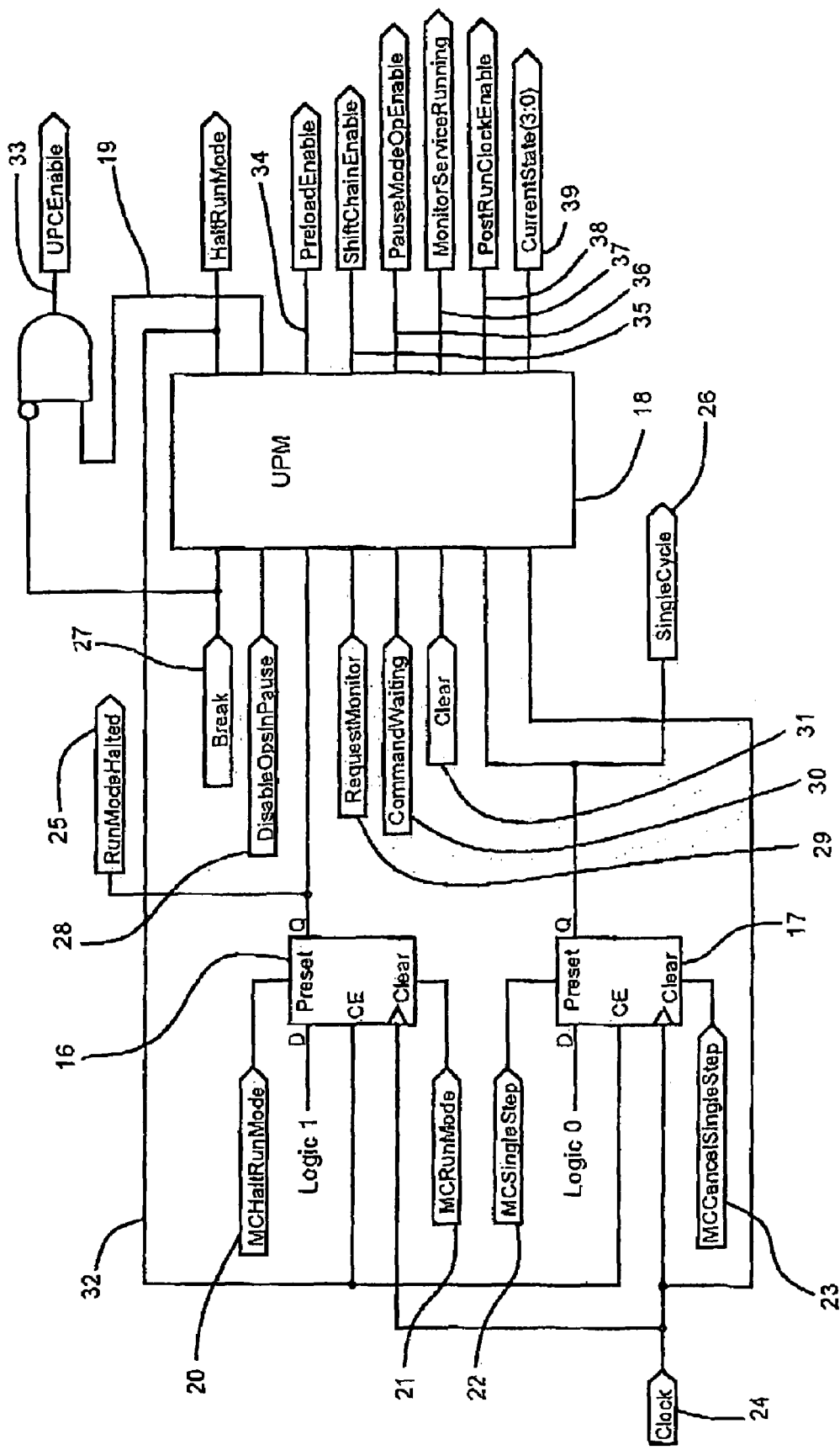
FIG. 3 is a schematic diagram of the user program framework (UPF) including the associated user program manager (UPM).
Figure 5:
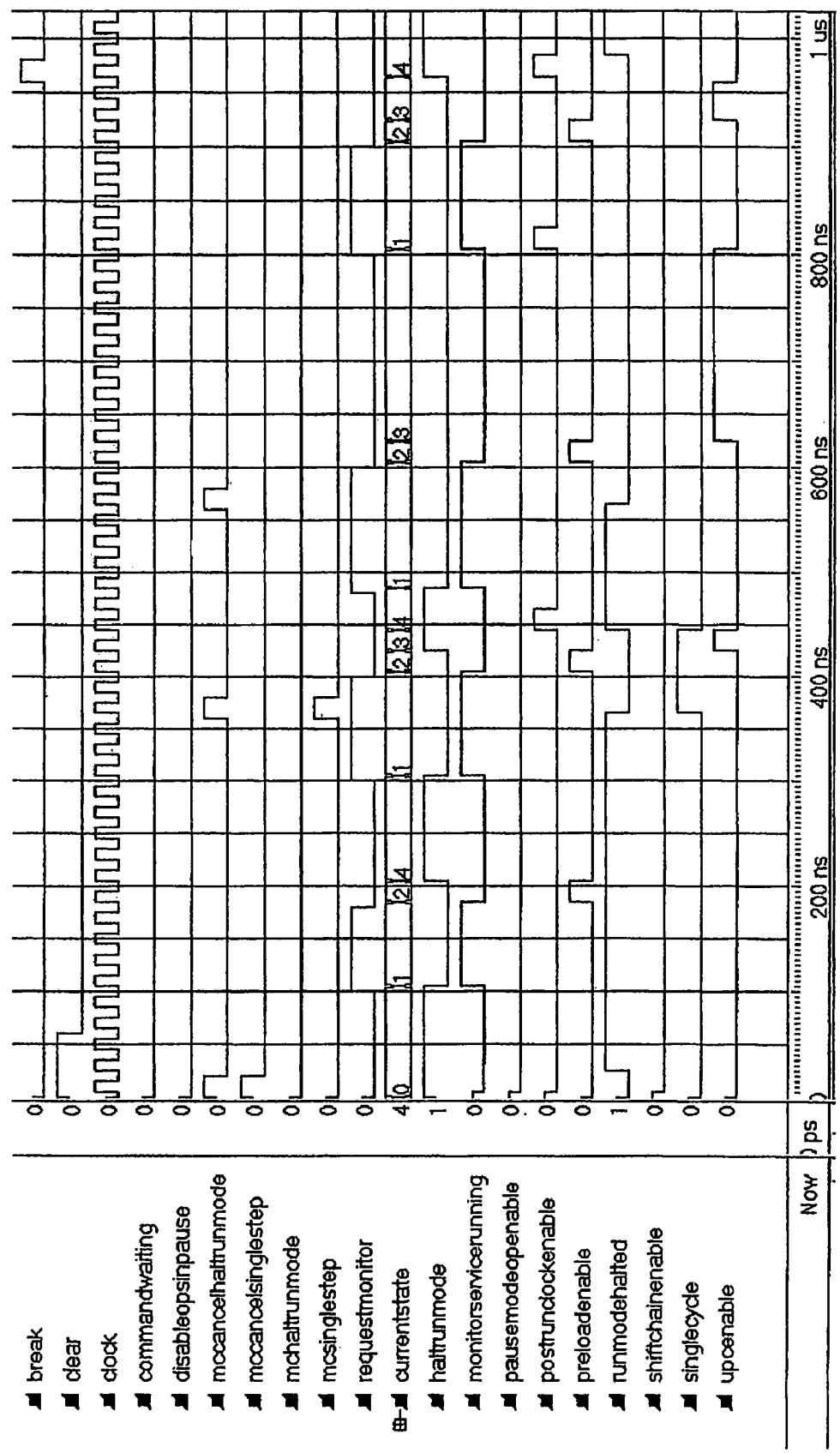
FIG. 5 is a printout of waveforms from the user program manager (UPM) simulated to demonstrate various operations of interest.

The user program manager (UPM) is described with the aid of FIGS. 3, 4, and 5.

FIG. 3 shows the essential features of the user program framework (UPF), how the monitoring computer (MC) interacts with the user program manager (UPM) at the user program manager (UPM) interface, and how the user program manager (UPM) outputs signals for controlling the user program circuit (UPC). The circuit consists of two D flip-flops 16 and 17 with clock enables, the user program manager (UPM) state machine 18 as detailed in FIG. 4.

The preset and clear inputs on the flip-flops are of the synchronous type, as is the general case throughout the user program circuit (UPC).

FIG. 4 is a listing of the user program manager (UPM) state machine code in the VHDL hardware description language. The listing can be compiled with Xilinx Inc's XST software and is suitable for behavioural simulation with Mentor Graphics' ModelSiM™ simulator for the purpose of understanding the waveforms required to control the PLDPC.

FIG. 5 shows waveforms from a minimal propagation delay behavioural simulation of the listing in FIG. 4.

In the description of the circuit operation we will use the following terminology:

Run mode, or running, is defined as being when the user program circuit (UPC) logic processing interval (LPI) clock is enabled.

Pause mode, or being paused, is defined as being when the user program circuit (UPC) logic processing interval (LPI) clock is disabled.

Run and pause modes are mutually exclusive.

Single stepping means running the user program circuit (UPC) for a single logic processing interval (LPI) clock cycle and then pausing.

In FIG. 3:

The signals 20 (MCHaltRunMode), 21 (MCRunMode), 22 (MCSingleStep) and 23 (MCCancelSingleStep) allow the monitoring computer (MC) to stop and start the user program circuit (UPC) run mode, and to request a single user program circuit (UPC) step and to cancel such a request. Signal 24 (Clock) is the clock that times the synchronous operation of the circuit shown and also the user program circuit (UPC).

Signal 25 (RunModeHalted) is the level that is controlled by signals 20 and 21, and that goes true when a user program circuit (UPC) halt is requested by the monitoring computer (MC). It is also set true when a break or the completion of a single step is sensed by the user program manager (UPM). It serves to instruct the user program manager (UPM) whether to generate a logic processing interval (LPI) and enable the user program circuit (UPC) clock.

Signal 26 (SingleCycle) serves to terminate a logic processing interval (LPI) after one clock pulse, and is itself then set false. In this way it controls user program circuit (UPC) single stepping.

Signal 27 (Break) is a signal originating from the user program circuit (UPC) and is true when a Break condition is sensed. It serves to halt the user program circuit (UPC) run mode.

Signal 28 (DisableOpsInPause), which is a request to disable the user program circuit (UPC) outputs when the user program circuit (UPC) is not running, signal 29 (RequestMonitor), which is a request for the user program manager (UPM) to provide monitoring services rather than run the user program circuit (UPC), and signal 30 (CommandWaiting), which informs the user program circuit (UPC) that a monitoring computer (MC) command is waiting, all originate from the monitoring computer (MC) via the communications circuits (CC). All are interrogated by the user program manager (UPM) as required.

Signal 31 (Clear) is the power-on reset signal for the programmable logic device (PLD).

Signal 32 (HaltRunMode) is generated by the user program manager (UPM) to set the RunModeHalted flip-flop, and reset the SingleCycle flip-flop if it is set.

Signal 33 (UPCEnable) is the main user program circuit (UPC) clock enable control used to run or halt the user program circuit (UPC) operation. This signal is also provided to the peripheral circuits to indicate that the user program circuit (UPC) is running.

Signal 34 (PreloadEnable) is a special clock enable signal used by the Preload related functions described later in this specification.

Signal 35 (ShiftChainEnable) is used to enable the shift chain clock to provide access to the user program circuit (UPC) state data for the monitoring computer (MC). This signal is not described in detail as there are many ways of accessing the user program circuit (UPC) state data, including shift register arrangements and random access arrangements, and the detail requirements for this signal depend on the arrangement used and the details of how that interfaces to the communications circuit (CC), if used, and monitoring computer (MC). The implementation of any chosen arrangement will be a simple matter to a person skilled in the art. Data access methods are described in GB 2371633, and are not part of the present invention for which claims are made.

Signal 36 (PauseOpEnableMode) determines whether the user program circuit (UPC) outputs will be automatically disabled when the PLDPC is in pause mode. It is combined with a signal directly from the monitoring computer (MC) via the communications circuits (CC) that controls whether the outputs will be disabled independent of run/pause.

Signal 37 (MonitorServiceRunning) is a handshaking signal that indicates to the monitoring computer (MC)/communications circuits (CC) that the PLDPC is ready for a monitor command to be issued, and is activated in response to signal 29 (Requestmonitor)

Signal 38 (PostRunClockEnable) is a special clock enable signal used by data display buffers designed to display combinational circuit state data resulting from the last active clock transition (ACT) prior to the data access interval (DAI) in which the data was accessed, as opposed to the state prior to the last active clock transition (ACT). See "Level Display".

Signals 39 (Currentstate (3:0)) are only present to aid interpretation of the simulation waveforms in FIG. 5.

The basic design principles of the user program manager (UPM) state machine of FIG. 4 require no explanation because the structure of a state machine is described in the industry standard VHDL hardware description language and available associated literature covers the design of such circuits. However, it is important to describe various aspects of the particular functionality, and this is best done with reference to the waveforms generated by the state machine shown in FIG. 5.

The sequence now described demonstrates in particular how the monitoring computer (MC) can cause the user program manager (UPM) to enter pause mode, to single step, to enter continuous run mode, and to respond to a breakpoint in the form of the Break signal, and how it generates correctly timed enable signals for the user program circuit (UPC), the preload buffers and the late display buffer. Operation controlling multiple-stepping of the user program circuit (UPC), as opposed to single-stepping or continuous run, is not described because persons skilled in the art will easily see how to modify the user program manager (UPM) and add a counter loadable from the monitoring computer (MC), enabled to count and be interrogated by the user program manager (UPM) to enable the user program circuit (UPC) for a certain number of clock pulses.

Only one state is ever active at any one time. The numbering of the states is coded into the VHDL of FIG. 4.

On FIG. 5:

At time 25 ns, we observe RunModeHalted going true in response to the level HaltRunMode generated in state InitState (indicated by CurrentState=0), even though MCRunMode had been asserted during the early part of the Clear signal. The purpose of InitState is to initialize various signals as listed in FIG. 4.

At 105 ns state Initstate becomes inactive and state WaitForCommand (indicated by CurrentState=1), becomes active in response to RequestMonitor being true. It can be seen that MonitorServiceRunning is true whenever WaitForCommand is active signalling to the monitoring computer (MC) that it can issue a command.

At 180 ns RequestMonitor goes false indicating the monitoring computer (MC) has made whatever changes were needed, in this simulation simply leaving RunModeHalted true.

At 185 ns state Preload becomes active in response to RequestMonitor and CommandWaiting both being false. It can be seen that PreloadEnable is true whenever state Preload (CurrentState=2) is active, but not at any other time. This is as required for use with the preload buffers.

One clock cycle later at 205 ns, in response to RunModeHalted being true state PauseState (CurrentState=4) becomes active, and that lasts until 305 ns when WaitForCommand again becomes active in response to RequestMonitor being true. No UPCEnable true level is produced when PauseState is active and so the user program circuit (UPC) is paused.

This time the monitoring computer (MC) asserts MCRunMode and MCSingleStep causing RunModeHalted to go false and SingleCycle to go true at 365 ns, then hands back control to the user program manager (UPM) by setting RequestMonitor false at 400 ns.

The user program manager (UPM) responds by going into the Preload state again at 405 ns and then into RunState (indicated by CurrentState=3) at 425 ns in response to RunModeHalted being false. HaltRunMode immediately goes true leading to the resetting of SingleCycle and setting of RunModeHalted following the next active clock transition (ACT). The UPCEnable signal comes true at 425 ns for one clock cycle only, thereby single-stepping the user program circuit (UPC).

The same active clock transition (ACT) at 445 ns, because SingleCycle is true prior to it, causes PauseState to become active with the PostRunClockEnable signal true. The latter only stays true for one clock cycle, not the whole time PauseState is active. Inspection will show the PostRunClockEnable signal is true for one clock cycle only every time the RunState becomes inactive independent of whether the next active state is PauseState or WaitForCommand.

The next RequestMonitor signal causes WaitForCommand to become active again, and this time at 565 ns the monitoring computer (MC) asserts MCRunMode, but without the MCSingleStep limitation. When RequestMonitor goes false, the user program manager (UPM) passes through Preload to RunState producing a true UPCEnable level, and hence continuously running the user program circuit (UPC) until the next RequestMonitor true at 805 ns.

After RequestMonitor is terminated, without making any changes the same as at 180 ns, the user program manager (UPM) passes through Preload into RunState where it soon encounters the Break signal true and responds accordingly at 965 ns by going into PauseState and deactivating the UPCEnable signal that was true in RunState. The raw UPCEnable signal 19 output by the user program manager (UPM) is gated off with the Break signal arranged to be operative for only one clock cycle after the Breakpoint is activated. This avoids the need to wait for the additional active clock transition (ACT) for the user program manager (UPM) to respond, and ensures that no more user program circuit (UPC) processing occurs after the breakpoint conditions are met.

User Program Circuit concepts

The PLDPC user program circuit (UPC) is normally implemented with a single clock timing the storage of new states in all flip-flops in the user program circuit (UPC), although slower speed subsidiary clocks can be implemented if required.

Clock Management

For the sake of design safety it is preferred that the clock signal is not gated, and therefore the clock signal is not made available to the user. This is enforced by the design of the user program circuit (UPC) component library provided. All of the monitorable flip-flops (MFFs) in the user program circuit (UPC) have their clock pins driven in parallel with the same clock signal via a low skew clock distribution system and operate on the same active clock transition (ACT).

Clock enable inputs allow the user, when appropriate, to determine whether any particular flip-flop will be clocked by any particular active clock transition (ACT).

Figure 6:
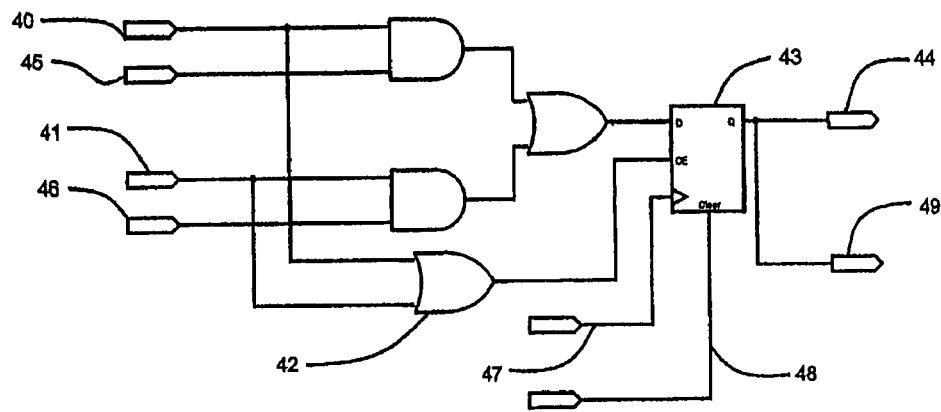
FIG. 6 is a schematic of a monitorable flip-flop (MFF) that can be used in a user program circuit (UPC) as implemented in this specification, but with a limitation in functionality that logic setting conditions in single step mode will be different to continuous run mode.
Figure 7:
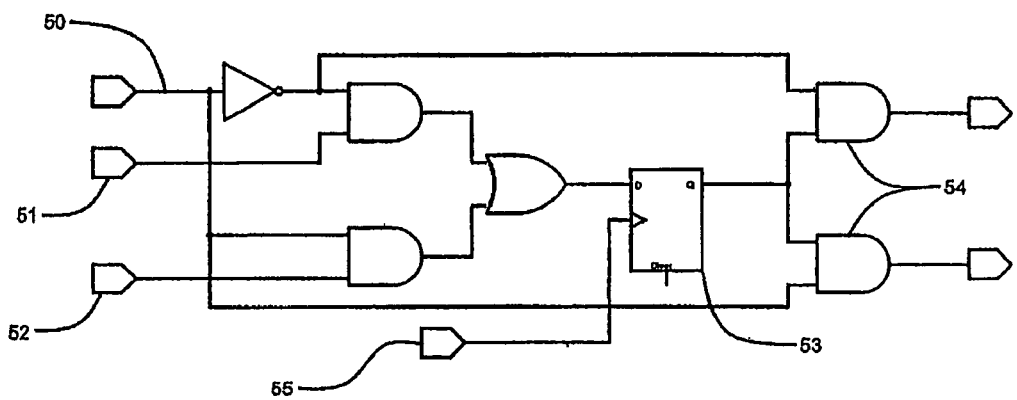
FIG. 7 is a schematic of a monitorable flip-flop (MFF) that can be used in a user program circuit (UPC) as taught in GB 2371633.

FIG. 6 shows the type of monitorable flip-flop (MFF) that may be used in the user program circuit (UPC) component library items, but is not directly available to the user. The monitorable flip-flop (MFF) is essentially the same as that shown in FIG. 10 of GB 2371633 which is reproduced herein as FIG. 7. The differences are:

the previous basic D flip-flop is replaced by a D flip-flop 43 having a clock enable input.

The previous D flip-flop is of a kind that may be found in almost all systems of logic, and is therefore very general, but requires gating of the clock signal. The present D flip-flop 43 is of a kind that can be found in modern FPGAs and CPLDs.

The present D flip-flop eliminates the need for user circuitry to gate the clock signal external to the flip-flop and facilitates the distribution of the clock signal within the FPGA via one of the special low skew distribution systems available in such devices.

The two output signal gates 54 have been eliminated as a trade-off to reduce logic requirements, although these can offer some advantages. Both output signals 44 and 49 are now driven directly from the Q output of the flip-flop 43.

The previous single signal 50 that controlled data multiplexing for both input and output data has been replaced in the present design with a pair of signals 40 and 41. The two signals allow four gating combinations, of which two, "passing both" and "passing neither" of the data inputs 45 and 46 to the D flip-flop 43, D input, are irrelevant, and so the present two signals effectively provide the same functionality as the previous single controlling signal, however it is considered more convenient to organize the overall system in this way.

The clock enabling logic 42 is now shown explicitly on the monitorable flip-flop (MFF) diagram to assist comprehension, although in practice the OR'd combination of UPCEnable and ShiftChainEnable is better generated centrally in a single location rather than in each monitorable flip-flop (MFF).

Although not shown, the D flip-flop 43 may have a preset input if convenient.

Persons skilled in the art will understand how to vary this circuit to achieve different trade-offs if they so desire, and will also understand the essential nature of the circuit, which is the way in which either the shift chain or user program circuit (UPC) data is multiplexed through the D flip-flop dependent on whether the operation of the shift chain or the user program circuit (UPC) is enabled.

Figure 8:
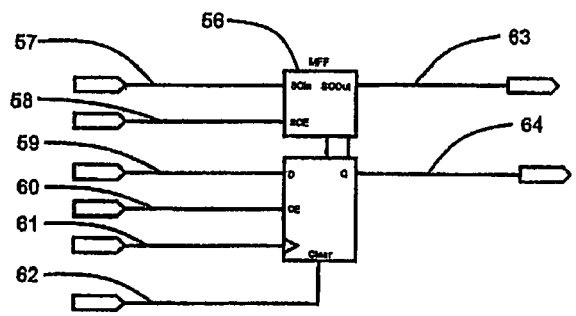
FIG. 8 is a schematic of a monitoring circuit used to display signal levels on the monitoring computer (MC), and also serves to illustrate the symbol used for a monitorable flip-flop (MFF) as detailed in FIG. 6 or FIG. 19.

The functions of the various I/O signals are now described together with their relationship to the I/O pins on the monitorable flip-flop (MFF) symbol shown in FIG. 8.

The correspondence of the signals is:

Signal 40 in FIG. 6 corresponds to the shift chain enable (SCE) pin 58 on the monitorable flip-flop (MFF) symbol in FIG. 8, Signal 41 in FIG. 6 corresponds to the CE pin 60 on the monitorable flip-flop (MFF) symbol, Signal 45 in FIG. 6 corresponds to the SCIN pin 57 on the monitorable flip-flop (MFF) symbol, Signal 46 in FIG. 6 corresponds to the D pin 59 on the monitorable flip-flop (MFF) symbol, Signal 47 in FIG. 6 corresponds to the Clock pin 61 on the monitorable flip-flop (MFF) symbol, Signal 48 in FIG. 6 corresponds to the Clear pin 62 on the monitorable flip-flop (MFF) symbol, Signal 44 in FIG. 6 corresponds to the SCOut pin 63 on the monitorable flip-flop (MFF) symbol, Signal 49 in FIG. 6 corresponds to the Q pin 64 on the monitorable flip-flop (MFF) symbol, Input Signal Requirements Input signals may be optionally asynchronous or synchronous. Traditional programmable controllers predominantly use asynchronous input signals.

Figure 9:
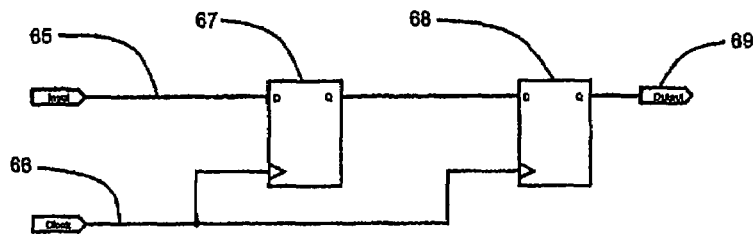
FIG. 9 is a schematic of a circuit used to synchronize and harden signals to combat metastability problems.

Asynchronous signals represent a problem in terms of being able to guarantee correct setup and hold times for following flip-flops, and require a protection circuit to ensure correct operation. FIG. 9 illustrates the principles of such a protection circuit.

When a signal 65 from the peripheral circuits is presented in an asynchronous manner, the signal can be sampled by a flip-flop 67 on the active clock transition (ACT) of clock 66 and allowed to settle for the remainder of the active transition interval (ATI) prior to sampling by following flip-flop 68 and ultimate delivery of the guaranteed signal 69 to following user program circuit (UPC) circuits, thereby allowing flip-flop 67 a defined period for settling to protect against metastability. Calculations based on programmable logic device (PLD) manufacturers' data can provide the necessary assurance that metastability problems will not occur due to the asynchronous nature of the signals.

The clock 66 for the protection circuit can be run at a slower rate synchronized to the main user program circuit (UPC)

clock, if that is desirable and necessary to allow sufficient settling time to overcome metastability.

Flip-flop 68 can be omitted if the output signal from flip-flop 67 can be delivered exclusively to the inputs of other following flip-flops without any significant propagation delay, thereby preserving the settling time available to the output of flip-flop 67.

The method provides for ease of use of input signals by the avoidance of setup and hold time problems although it introduces some delays. It is made available in the present invention by the use of special input terminal circuits and symbols from the user program circuit (UPC) component library.

The peripheral circuits can also be arranged to present the necessary input signals in a synchronous manner with setup and hold times guaranteed to provide correct operation and referenced to a suitable clock edge or strobe. In this case the signals may be distributed and used in the user program circuit (UPC) without the need for metastability hardening circuits, but the peripheral circuit timing requirements and design may be less convenient.

As an example of usage, asynchronous microprocessor data can be input to the system by latching the data with the trailing edge of the microprocessor write strobe, and then hardening each latched data bit using the circuit of FIG. 9.

Output Signal Requirements

As with input signals, there are two options for output signals. With traditional programmable controllers, the predominant method is that all outputs are latched.

The latching is provided in our preferred embodiment by a latched output terminal circuit and symbol to be described later. Use of latching is mandatory if the output signals are derived from user program circuit (UPC) monitorable flip-flops (MFFs) because monitorable flip-flops (MFFs) may have their state values disturbed during the data access interval (DAI). Allowing logic to settle and latching the output state from the settled logic also provides glitch free outputs.

Our previous GB 2371633 also teaches other methods of accessing user program circuit (UPC) states, such as random access methods, and these methods do not necessarily disturb user program circuit (UPC) states during access.

The option of leaving outputs unlatched may be desirable for purely combinational logic pathways from input terminals, through the user program circuit (UPC), to output terminals, even though such applications may be in the minority.

Synchronous Logic

Benefits accrue when it is feasible to latch both input and output signals. When this is done, all of the user program circuit (UPC) can be implemented synchronously, and inspection will show that such a user program circuit (UPC) consists of a network of flip-flop storage elements, some with their inputs driven from input terminals, and with their outputs connected to the inputs of other flip-flops or output terminals either directly or by pathways through combinational logic, and with a single clock driving each flip-flop in parallel.

Figure 10:
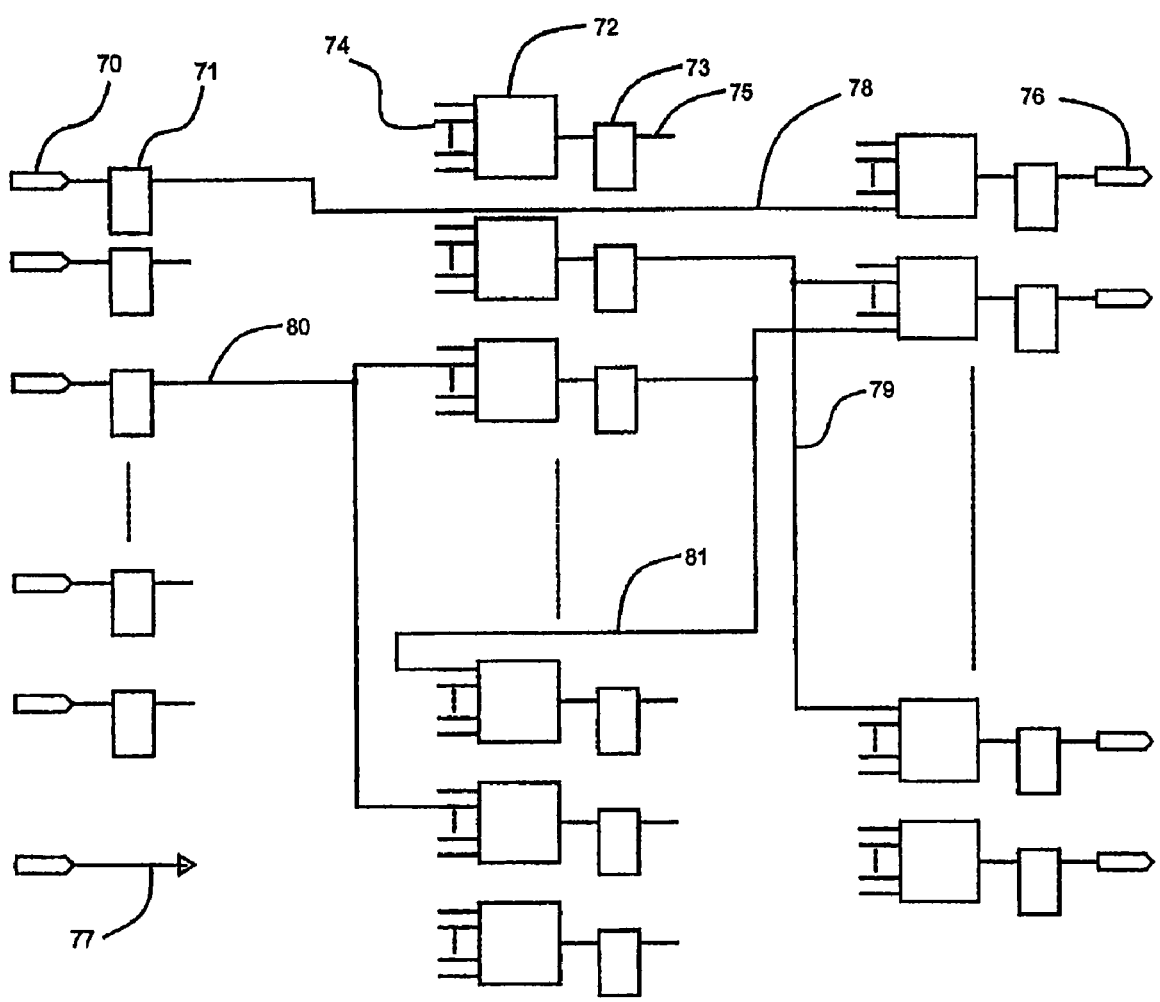
FIG. 10 is a general illustration of a synchronous logic circuit.

In FIG. 10, which is designed purely to illustrate the generalized concept of synchronous circuits as used in this specification. we see three types of circuits:

Input circuits consisting of an input terminal, for example 70, connected to the input of a flip-flop for example 71, logic processing circuits consisting of a combinational logic block, for example 72, connected to a flip-flop, for example 73, and having as many input connections as required, for example 74, and with the flip-flop output, for example 75 available to drive subsequent stages, output circuits, with a terminal, for example 76, for connection to peripheral circuits, and otherwise like the logic processing circuits.

Each of these three types of circuits appears as often as required.

There is also a clock signal input 77 shown. The clock is distributed to each flip-flop to synchronize circuit operation.

There are various signal connections as required to provide the desired functionality, only a few of which 78, 79, 80, 81 are shown as examples. Each combinational logic block for example 72 consists of logic as required to provide the desired functionality.

Circuit operation of a synchronous circuit of the type described consists of two steps repeating cyclically in time with the clock:

Firstly, the occurrence of an active clock transition (ACT), at which point each flip-flop samples its inputs and either changes state or not as appropriate, and secondly the propagation of any changed state through to the output of each flip-flop and through any combinational logic driven from the changed flip-flop output signals. The whole circuit finally settles with stable signal levels at the inputs to each flip-flop and throughout the whole circuit, Indirectly Accessible Devices Where it is possible to link the user program circuit (UPC) flip-flops directly into the shift chain, access to the stored data becomes easy as described in GB 2371633. There are however other resources in a typical programmable logic device (PLD), such as RAM, which contain storage elements that are not directly accessible and that require a different approach. We shall term such devices Indirectly Accessible Devices. Such resources can be accessed by embedding the resource in an interface circuit in such a way that all the critical signals, data, transactions and activities can be captured by flip-flops that are part of the interface circuit and that are linked into the shift chain.

It is a straightforward matter to design a circuit, using RAM as an example, that will allow the monitoring computer (MC) to read the value stored in any desired memory location or to write a new value into any location. Any such access would of course occur during the data access interval, and therefore be free of contention with normal user program circuit (UPC) operation.

Once an interface circuit is designed it can be combined together with the indirectly accessible device (IAD) to make a user program circuit (UPC) component library item that is directly usable in the user program circuit (UPC) and able to be accessed by the monitoring computer (MC).

Interface Circuit Example

Figure 11:
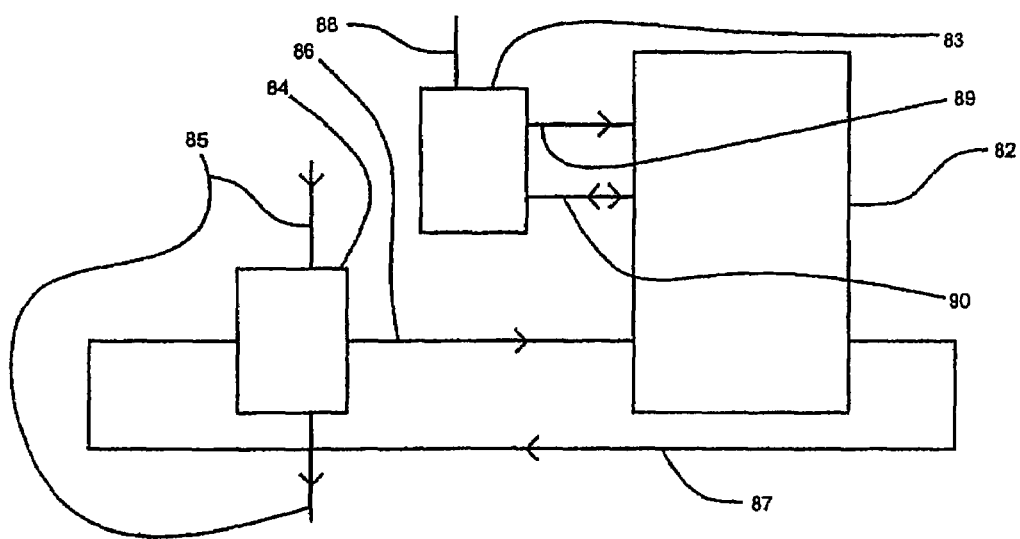
FIG. 11 is a block diagram illustrating the method of interfacing to indirectly accessible devices (IADs).

As an example, the interface circuit for a RAM 82 is shown in FIG. 11, including:

a control circuit 83 with a counter to provide address signals 89 and circuits to provide necessary control signals 90 such as read and write signals, controlled by the user program manager (UPM) via signals 88, and a shift register 84 that can be loaded with data from the RAM on signal(s) 87, and that can deliver data to the RAM on signal(s) 86 arrows showing the direction of information flow where significant.

The circuits can be designed such that each shift of the shift chain increments the counter which is initially set to zero. The number in the counter, suitably adjusted to allow for the data width, can be used as the memory address for accessing the RAM. The counter is arranged to roll over to zero when it is incremented past the value equivalent to the number of bits in the RAM. Because the shift chain is a circular shift register, as data is shifted out of the RAM interface downstream towards the monitoring computer (MC), other data is shifted into the interface from upstream. It is arranged that as each word, of whatever data width that may apply, is read out of the RAM to be shifted downstream, the word is replaced in the RAM by a word from upstream.

The process of reading the RAM is:
1. set counter to zero,
2. read outgoing RAM data into shift chain and incoming data into RAM
3. shift the shift chain 85 by the number of bits in the data, incrementing the counter once for each bit
4. repeat 2) and 3) until the complete shift chain has been rotated.

In the way described, the complete RAM contents, together with the other data in the shift chain, can be read and if necessary modified in one shift chain rotation. The RAM appears to the monitoring computer (MC) as a shift register in the shift chain of length equivalent to the number of bits in the RAM plus any additional bits used for temporary storage, etc.

User Program Framework (UPF) to Monitoring Computer (MC) Communications

Communications between the user program framework (UPF) and the monitoring computer (MC) can use any appropriate and convenient technique, such as parallel I/O ports, an address and data bus arrangement, a serial link, and such like.

Achieving Correct Behavioural Operation.

When the user program circuit (UPC) is entered into the PLDPC as described, user program circuit (UPC) monitorable flip-flops (MFFs), as individual components or as contained in more complex functions, or as interface devices for indirectly accessible device-based (IAD) user program circuit (UPC) component library items are arranged to be part of the shift chain so that their state is accessible to the monitoring computer (MC) for display or modification purposes. The monitoring computer (MC) display updates at a rate appropriate for human observation and so all values in a rapidly updating counter will of course not be displayed, nor could they be seen if they were. User program framework (UPF) flip-flops do not normally appear in the shift chain.

Level Display

Combinational logic, while it is visible on the user schematics, has no stored state data included in the shift chain. However, the user is able to display the state of any node within a combinational logic network by placing a special level display component on the schematic from the user program circuit (UPC) component library and connecting it to the node of interest. The level display component contains a monitorable flip-flop (MFF) that is automatically located in the shift chain by the software. The state may typically be displayed on a user program circuit (UPC) diagram as a '1' or '0' or as a graphic of a lamp that is on or off as at 96 on FIG. 12.

The circuit for the level display is shown in FIG. 8, and is simply an monitorable flip-flop (MFF) as shown in FIG. 6 suitably connected. In FIG. 8, the monitorable flip-flop (MFF) is shown as a symbol 56 representing the circuit in FIG. 6.

The signal assignments to the I/O connections in FIG. 8 are:
Signal SCOut from the previous user program circuit (UPC) shift chain stage is connected to SCIN pin 57,
Signal ShiftChainEnable 35 is connected to shift chain enable (SCE) pin 58,
The signal from the node to be monitored is connected to D pin 59,
Signals as discussed below may be connected to CE pin 60,
The Clock signal 24 is connected to Clock pin 61,
The Clear signal 31 is connected to Clear pin 62,
The SCOut pin 63 is connected to SCIN of the next stage in the user program circuit (UPC) shift chain,
The Q pin 64 is unused.

The state of the monitorable flip-flop (MFF) can be arranged to reflect the level on the node prior to the last user program circuit (UPC) enabled active clock transition (ACT) prior to the shift chain being read, or to reflect the state after the last user program circuit (UPC) enabled active clock transition (ACT) depending on the signal selected to drive CE pin 60. Pin CE is driven by the UPCEnable signal 33 for the former, and the PostRunClockEnable signal for the latter.

Forcing Buffer

Figure 12:
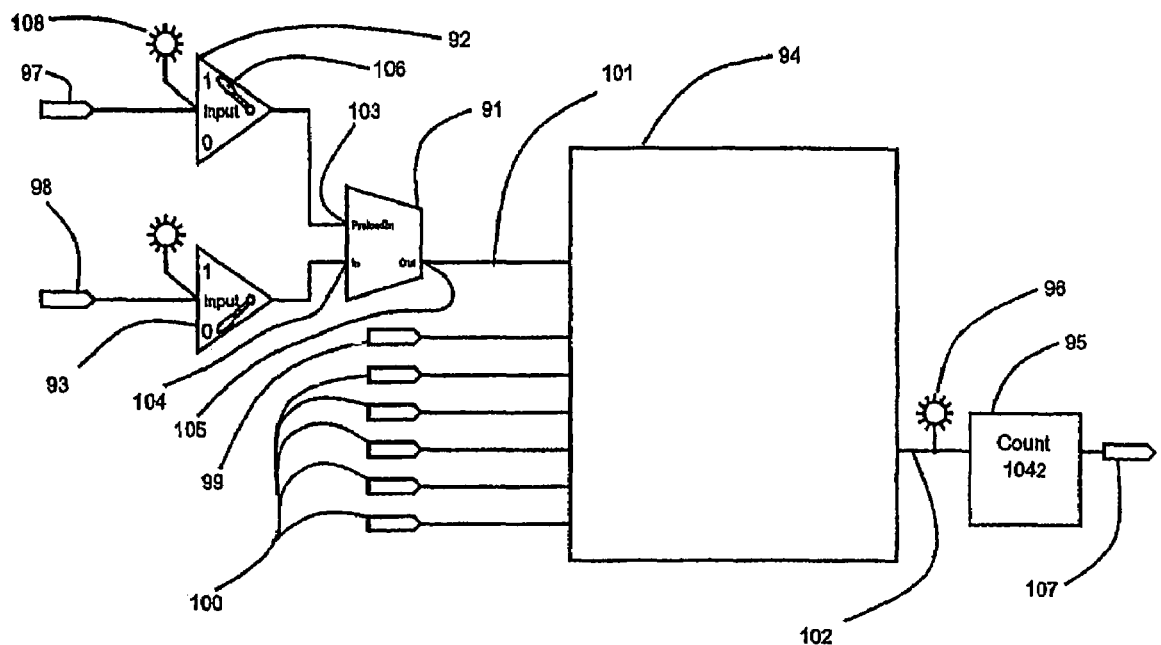
FIG. 12 is an example of a user program circuit (UPC) schematic of the kind that the user may enter on the monitoring computer (MC), and illustrates ways of inputting user modifications and displaying system state data.

A forcing buffer is provided, as a user program circuit (UPC) component library item, that allows the user to force user program circuit (UPC) signal levels to '1' or '0' or leave them unforced. Typically, a graphic of a three position toggle switch 106 on the schematic symbol allows the user to choose "Force to 1", "Force to 0" or "transmit signal unchanged" using the monitoring computer (MC) and a mouse. An example of a user user program circuit (UPC) schematic is shown in FIG. 12, and shows such forcing buffers at 92 and 93.

The user breaks the signal line at the point the forcing is to be applied and inserts the component in the signal line. The connection from the signal source goes to the forcing buffer input, and the connections to the signal loads are connected to the buffer output.

Figure 13:
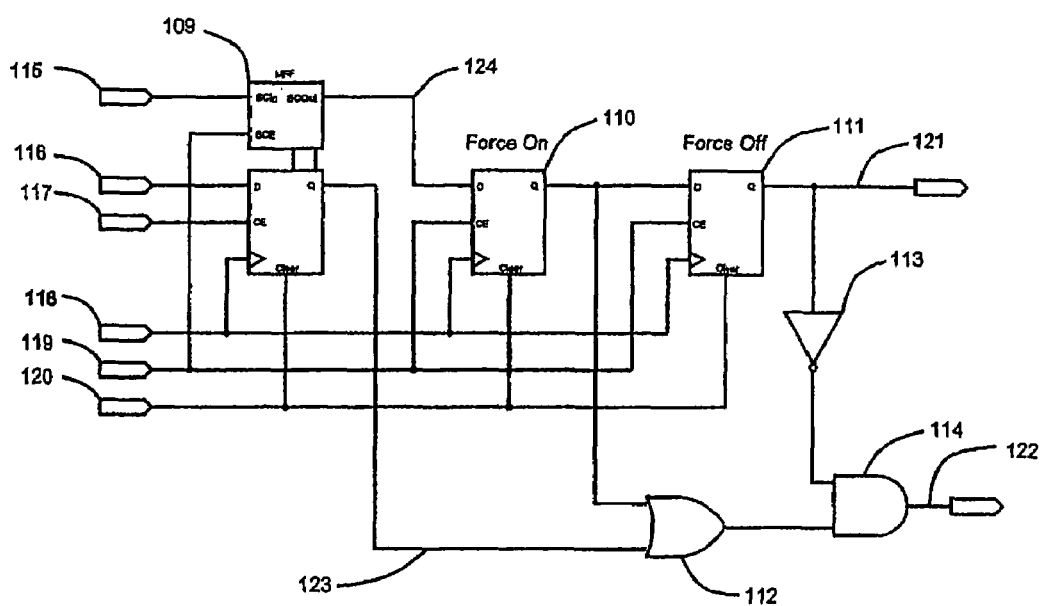
FIG. 13 is a schematic of a forcing buffer circuit used to enable the user to force signal levels.

FIG. 13 shows the circuit of the forcing buffer with an monitorable flip-flop (MFF) 109 arranged to provide an input level display and also a one clock delay.

The forcing buffer is implemented using D flip-flops 110 and 111 inserted in the shift chain to store the forcing information, and combinational logic 112, 113 and 114 to derive the buffer output as required. Flip-flops 110 and 111, do not need to be monitorable flip-flops (MFFs) as they have no user customizable connections and are only accessible to the user via the monitoring computer (MC) and the shift chain. The circuit may also optionally provide an input and/or output display function in the manner of the level display component discussed previously.

Flip-flop 110 when set indicates the output should be forced on, and flip-flop 111 indicates force off. The monitoring computer (MC) does not set both flip-flops 110 and 111 at the same time.

The signal assignments to the I/O connections in FIG. 13 are:
The SCOut output of the previous stage in the user program circuit (UPC) shift chain is connected to pin 115,
Signal ShiftChainEnable 35 is connected to pin 119,
The signal from the driving node in the user program circuit (UPC) is connected to pin 116,
UPCEnable signal 33 is connected to CE pin 117,
The Clock signal 24 is connected to Clock pin 118,
The Clear signal 31 is connected to Clear pin 120,
The SCOut pin 121 is connected to the next stage in the user program circuit (UPC) shift chain,
The Output pin 122 is connected to the driven node in the user program circuit (UPC).

The combined input level display and one clock delay may be omitted by:
Deleting monitorable flip-flop (MFF) 109,
Connecting pin 115 directly to signal 124

Connecting pin 116 directly to signal 123

Omitting Pin 117

Input Terminals

Input terminal symbols are used as the means whereby the user 'connects' the user program circuit (UPC) input points to external input signals via the physical terminals on the PLDPC using the monitoring computer (MC) and the software provided. The symbols used on the user program circuit (UPC) diagram may appear graphically as no more than simple terminals 97, 98, but assuming the signals connected are asynchronous and the terminals provide the preferred metastability protection, then they will at least contain hidden flip-flops. They may also contain display and forcing functionality as previously discussed.

Figure 14:
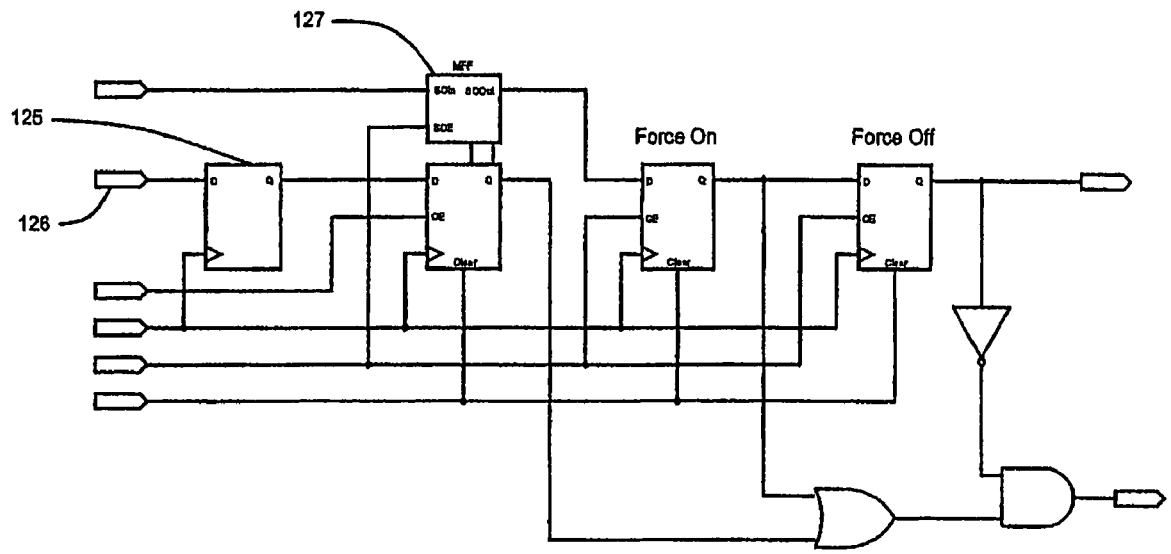
FIG. 14 is a schematic of an input terminal circuit used to enable the user to force signal levels as well as input signals to the user program circuit (UPC) from the peripheral circuits.

FIG. 14 shows an input terminal circuit providing forcing, input level display and metastability protection. Inspection will show that the circuit is identical to that of FIG. 13 with the addition of a D flip-flop 125 to the input signal circuit 126. The D flip-flop operates with the monitorable flip-flop (MFF) 127 as described for FIG. 9 to provide the metastability protection.

Output Terminals

Output terminal symbols 107 (in FIG. 12) are used as the means whereby the user 'connects' the user program circuit (UPC) to external output signals via the physical terminals on the PLDPC using the monitoring computer (MC) and the software provided. The symbols provide output registers and will at least contain flip-flops. They may also contain display and forcing circuits as previously discussed.

Output terminals may also be provided with the circuitry necessary to disable the outputs on demand, either from the user program circuit (UPC) or the monitoring computer (MC). Disabling may consist of either tri-stating the output, or switching it to whatever is considered the fail-safe level.

Figure 15:
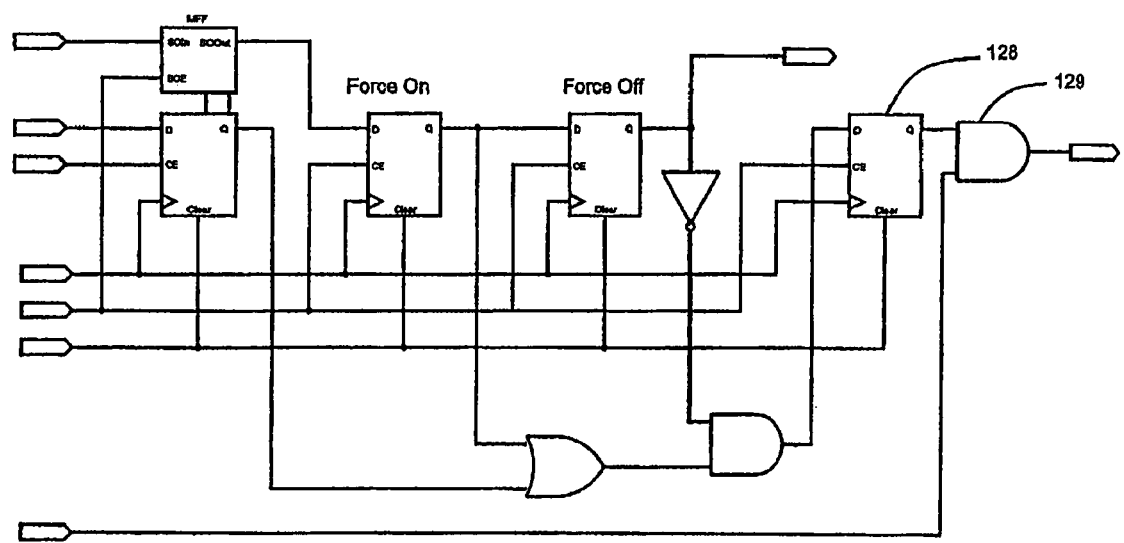
FIG. 15 is a schematic of an output terminal circuit used to enable the user to force and enable or disable signal levels as well as output signals from the user program circuit (UPC) to the peripheral circuits.

FIG. 15 shows an output terminal circuit providing forcing, an monitorable flip-flop (MFF) providing a one cycle delay and data display, a final D flip-flop 128 to latch the output signal to hold it at a constant level during data access intervals (DAIs) and a gate 129 to disable the output when required. Inspection will show that the circuit is identical to the circuit of FIG. 13 with the addition of the final D flip-flop 128 and the disabling gate 129.

Persons skilled in the art will readily see how the Level Display, Forcing Buffer, Input Terminal and Output Terminal circuits can be rearranged to provide various combinations of the features described as may be desired.

Bidirectional Terminals

Bidirectional terminals are provided by a combination of the input and output terminal methods with a tri-state capability.

Function Values

Typically the user program circuit (UPC) component library function blocks will contain state values related to their function. A counter or a timer is probably the simplest example of this, with the state values being the number counted so far or the time left to run. The monitoring computer (MC) typically extracts these state values from the circuit state data and displays them as shown on the graphic of function block 95.

The values displayed are not limited to numerical values, and may be displayed in a character based or symbolic form, or purely graphically as switches accessible to the user to change optional settings. As a further example, functions such as state machines can also have their active states displayed by highlighting or colour changes.

The monitoring computer (MC) also enables the user to modify values by double clicking them on the symbol and entering a new value into a dialog box that appears. The monitoring computer (MC) ensures that the new value, provided it is valid, is placed into the appropriate flip-flops in the user program circuit (UPC) via the shift chain.

Waveform Display

As has been mentioned, the user may, via the monitoring computer (MC), pause or single step the program, or run it continuously. Pausing the program is a matter of turning off the user program circuit (UPC) logic processing interval (LPI) clock enable. Single stepping is a matter of enabling the user program circuit (UPC) logic processing interval (LPI) clock enables for a single logic processing interval (LPI) clock cycle. All of this is done by the user program manager (UPM) in the user program framework (UPF), and has been described in conjunction with FIGS. 3 and 4.

Because the monitoring computer (MC) can single step the user program circuit (UPC), it can sequentially:

cause the user program circuit (UPC) to take a single step, optionally on the user's command, extract and then record the state data, and continue to repeat this step and record sequence as long as required.

From that point it is a simple matter to display the values of the state data from the shift chain for any selected part of the user program circuit (UPC) as a waveform with the horizontal axis calibrated in clock cycles or converted into a time scale, equivalent to totally continuous running times, via the known clock frequency.

This waveform display method has automatic access to all state data without a need to make any connections other than the normal monitoring computer (MC) connection.

Even though the system only enters the run mode briefly during each single step, while in run mode it operates with an active transition interval (ATI) identical to the continuous run mode active transition interval (ATI). Special methods that will be described are provided for ensuring that logic settling times are the same in both run and single-step modes so that the data extracted is a valid reflection of run mode performance.

The proportion of time spent in run mode while accumulating waveform data is of course a limiting factor in relation to the overall speed of operation, but nevertheless such a waveform display is a very useful tool for identifying problems with circuit operation.

Breakpoints

Breakpoints provide a way of trapping the occurrence of error or other conditions on which it is desirable to freeze the circuit and examine the circuit state.

The user program circuit (UPC) component library provides breakpoint symbols. These allow a node or nodes in the user program circuit (UPC) to be connected by the user to the breakpoint input of the user program manager (UPM) such that when the node goes to '1' or '0', as chosen by the user, the user program manager (UPM) senses the level change and causes the user program circuit (UPC) to halt by disabling the Logic Processing clock. The monitoring computer (MC) can access data to allow it to determine that a breakpoint has occurred and announce that to the user. This has been described in conjunction with FIGS. 3 and 4.

To set a breakpoint activated by a logic expression, rather than a simple signal, the user can either place suitable expression evaluating logic in the user program circuit (UPC) to generate the required breakpoint signal from the signals available, or the monitoring computer (MC) software can handle the necessary generation of the expression code and connections required.

Long Timescale Waveform Display

It has been described how waveforms can be displayed by gathering data from the shift chain, and how the time taken to read the shift chain is a limiting factor, because it slows down the overall operation of the circuit, and substantial time may be required to accumulate the waveform data for a desired period of user program circuit (UPC) operation.

An alternative technique may be used to display waveforms, which removes much of the limitation due to the time taken to gather data. Whereas the previously mentioned technique repeatedly single steps the user program circuit (UPC) and records shift chain data after every step, the alternative technique runs the user program circuit (UPC) in continuous run mode, maintaining control of it by automatically setting breakpoints prior to running it, and regaining control when a breakpoint is triggered.

The monitoring computer (MC) can be sure that any signal causing a breakpoint trigger has only just changed to the specified trigger level in the clock cycle at which the trigger occurs, and has not been at that trigger level at any other time between when the monitoring computer (MC) started the continuous run and the trigger point. Providing a counter, called a run timer, to record the number of clock cycles that occur during the continuous run period up to the breakpoint trigger, and having the monitoring computer (MC) record the signal level existing at the start of the run period and set the breakpoint to trigger at the other level ('1' in the case of an initial '0', or '0' in the case of an initial '1'), enables the monitoring computer (MC) to determine how long it takes in clock cycles for the waveform to change from one known level to the other.

Once a trigger has occurred, by determining which signal caused the trigger (if more than one signal has a breakpoint set on it), and by knowing which level was set to cause the trigger, the monitoring computer can set the breakpoint again, but this time for the other level. That is, if it has just triggered by going to '1', then it will be set to trigger next when it goes to '0'.

Repeating the steps of:
running continuously until a breakpoint is triggered,
determining the length of the run from the run timer, and
setting the breakpoint for the other level, enables the monitoring computer to determine the waveform of the signal monitored.

More fully, the process for one signal consists of—
1. determining the initial signal level and recording it,
2. setting a breakpoint on the signal that will trigger when it switches to the other level,
3. putting the system into continuous run and waiting for the breakpoint to trigger,
4. determining from the run timer the number of clock cycles for which the circuit ran and recording the number,
5. setting the breakpoint on the signal to trigger when it switches to the other level,
6. repeating the process from 3. above for as long as desired.

The process can be implemented for more than one signal by:
1. determining the levels of all signals at the start and recording them,
2. setting breakpoints in the manner described individually for each signal of interest,
3. continuously running the circuit until a breakpoint triggers,
4. determining how long the run was for,
5. determining which signal(s) have changed level,
6. recording the run length and signal(s) that changed,
7. reversing the breakpoint trigger level setting(s) for those signal(s) that have changed only, and
8. repeating the process from 3. above for as long as desired.

It can now be seen that the user program circuit (UPC) runs at full speed until a breakpoint occurs, and that the system can accumulate waveform data on as many signals as it is possible to set breakpoints on at any one time. The additional time added to the measurement process is broadly proportional to the number of clock cycles in which breakpoints trigger, that is in which signal transitions occur. Broadly, for waveform sets in which all signals are slow, that is in which transitions occur infrequently, waveform data may be accumulated at a speed approaching that of full continuous circuit operation.

Implementing a Long Timescale Waveform Display is a matter of the monitoring computer (MC) recording the starting level, and the transition times for each signal monitored and displaying the waveforms defined by that data in a suitable form as commonly done with logic analyzers or logic simulators.

Any group of signals designated by the user as defining an integer or other multi-bit type may be displayed in a way suitable to that type, for example either as a numerical value, alphabetical value, or as an analogue value as displayed on an oscilloscope.

Values, other than the signals on which breakpoints are set, may also be recorded and displayed, although with the system so far described, only at the points in time at which breakpoints trigger. To do so, the monitoring computer simply logs the relevant shift chain data existing at each trigger point. The monitoring computer can then display these values, with or without also displaying the triggers.

The monitoring computer (MC) may also be programmed to
wait for some particular individual trigger or triggers or combination of triggers to initiate gathering and display of data by repeated single stepping in the manner described under Waveform Display above, optionally for a user defined number of steps, and optionally repeating the procedure as required by the user, or to
wait for some particular run time as determined by the run timer before starting to gather data for display in one of the ways described, including repeating any defined procedure as advantageous to the user.

By way of example, but not limited to these cases, values representing slow analogue data can be sampled at fixed intervals, or complex circuit state values can be recorded at irregular intervals characterized by the occurrence of some defined combination of trigger signals, or sequence of combinations. The system as described allows the monitoring computer to be programmed to implement any advantageous combination of these possibilities.

The run timer itself may advantageously be connected to the breakpoint system so that it triggers a break when its counter overflows and rolls over to zero. In that way, the monitoring computer (MC) becomes aware of the overflow and can keep track of the total number of cycles counted by the run timer, to a much larger value than the capacity of the run timer itself, thus enabling the circuit resources invested in the run timer to be minimized without significant disadvantage and with minimal slowing of circuit operation.

Those skilled in the art will easily see how the monitoring computer, using the techniques described, may be programmed, optionally while providing circuit stimuli via the shift chain as necessary, to:
use the run timer to control and run the user program circuit (UPC) from its initial state for a given convenient number of clock cycles, stop and record the circuit state at that point, and continue on from that point repeating the process, determine the total number of cycles that have occurred when a breakpoint triggers, reload a suitable previous circuit state recorded a convenient number of clock cycles prior to the breakpoint, and use single step and record techniques to determine each successive circuit state up to and, if desirable, beyond the clock count position of the breakpoint, thus enabling the display of detailed cycle-by-cyle user circuit state data for a user-defined convenient number of clock cycles prior to the breakpoint trigger, while at the same time avoiding the need (and associated time penalty) to single step and record every circuit state that occurs between the initial circuit state and the trigger.

The run timer is either included in the shift chain, or otherwise made available to the monitoring computer, as most convenient so that its count value may be read and written.

Breakpoint Circuitry Suitable for Long Timescale Waveform Display

The following describes breakpoint circuitry suitable as a basis for a Long Timescale Waveform Display, although this circuitry may also be used advantageously for normal breakpoint implementations for debugging.

The functionality provided includes— breakpoints triggered by a change in a breakpoint trigger signal from one level to the other, rather than by the signal being at a defined trigger level (that is, a trigger is generated once only on a transition), breakpoints taking effect immediately, preserving the circuit state that caused the breakpoint for examination and recording, the ability to select to break on either polarity of transition, that is to break either on a change from Boolean '0' to '1', or '1' to '0', the ability to enable or disable any particular connected breakpoint trigger signal without re-compiling and reloading the user program circuit (UPC) bit pattern, the ability to determine (read) the existing level of a breakpoint trigger signal, the ability to determine (read) whether a breakpoint or breakpoints have triggered in the last enabled user program circuit (UPC) clock cycle, and if so, determine which signal(s) caused the triggers.

To ensure that the breakpoint takes effect immediately, the user circuit enable (UCE) signal must be generated as shown in FIG. 3, where it is shown as 33 and going to the connector labeled UPCEnable. The method shown ensures that when the Break Signal 27 goes true during the breakpoint trigger pulse, the user program circuit (UPC) is immediately disabled by the AND gate that combines signals 19 and 27 to produce signal 33. The AND gate has an inverted input to which signal 27 is connected. When signal 27 goes to '1' signal 33 immediately goes to '0', hence preserving the user program circuit state that generated the breakpoint trigger. Without the disable functionality provided by the AND gate, the user program circuit would operate for one more clock cycle, which is the time it takes the UPM state machine 18 to sense the break trigger pulse and turn off signal 19. The additional clock cycle operation would destroy the circuit state causing the break, making it unavailable for examination.

In overview, the breakpoint circuit and system consists of a circuit block with an output that delivers a breakpoint trigger pulse, lasting a single user program circuit clock cycle, to the Break input 27 shown in FIG. 3 whenever a breakpoint is triggered. The block has a convenient number of inputs for breakpoint trigger signals. These inputs are connected to signals in the user program circuit (UPC) by the user prior to the generation of the user program circuit (UPC) bit pattern to be downloaded into the PLD. These connections define the potential breakpoint trigger signals that may be enabled or disabled after the user program circuit (UPC) is downloaded and running. The block also has connections as convenient to enable the monitoring computer (MC) to use the functionality provided. These connections may for example be standard shift chain connections as previously described, and as shown for a single channel in FIG. 21.

Figure 21:
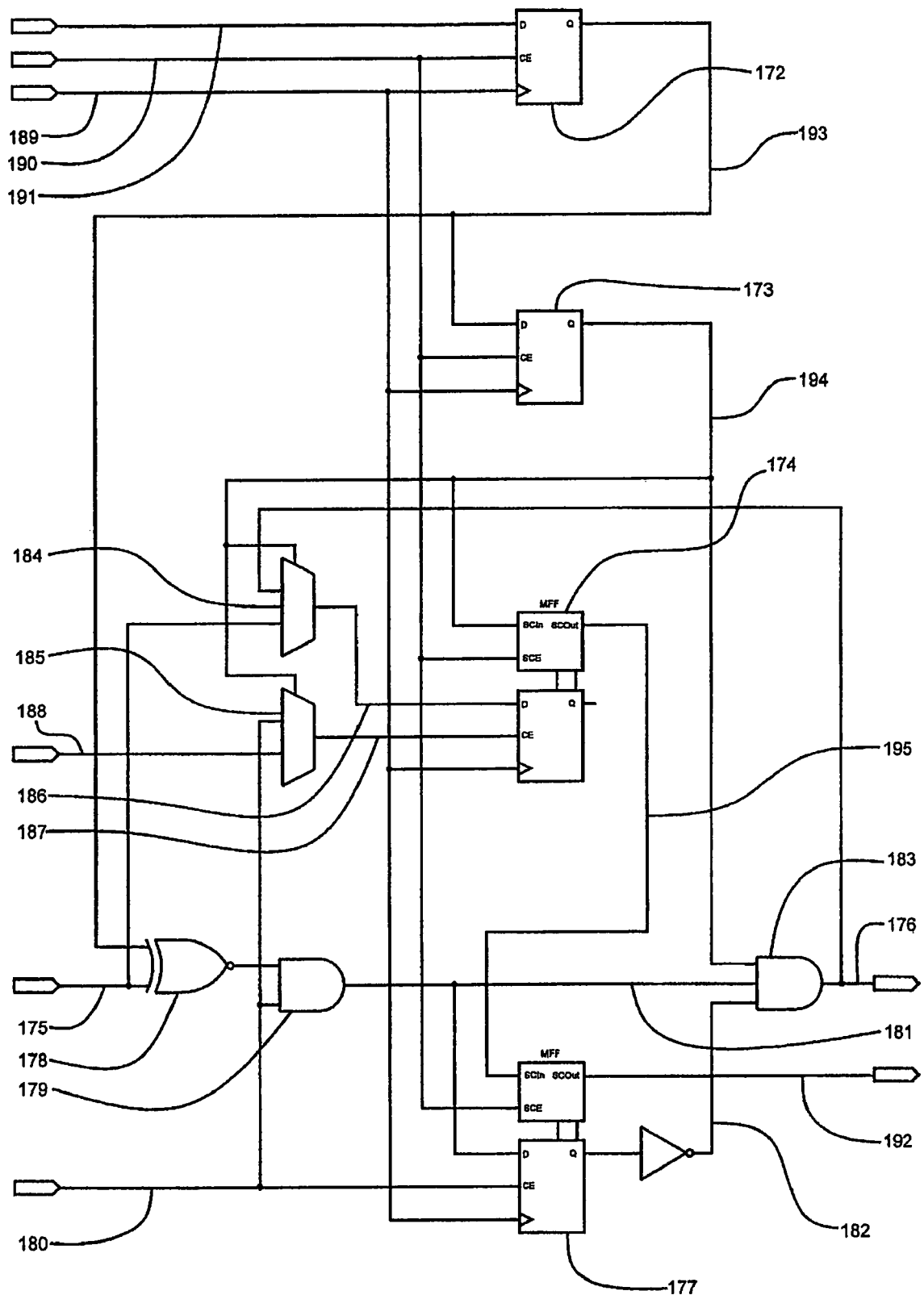
FIG. 21 is the circuit of a user configurable breakpoint channel, used to monitor a single breakpoint trigger signal, that produces a break trigger pulse when a break condition is sensed.

Internally within the breakpoint circuit block there is:

one breakpoint channel circuit as in FIG. 21 for each breakpoint trigger signal 175, and an OR gate, wide enough to OR together the breakpoint trigger pulse signals 176 output by each channel, one signal from each channel, and a run timer counter that counts the number of clock cycles enabled by signal 33, and that generates a breakpoint trigger pulse during the clock cycle when it rolls over from full to zero, also connected to an input on the OR gate, all suitably connected to provide monitoring computer (MC) access to data and for control.

Each breakpoint channel as shown in FIG. 21 broadly consists of:

1. a standard D flip-flop 172 used to select the polarity of the triggering transition, arranged in the shift chain so that it can be written to '1' or '0' by the monitoring computer (MC) for the purpose of controlling whether the channel will generate a breakpoint trigger pulse 176 on a '0'to '1' or on a '1' to '0' transition of the breakpoint trigger signal 175 if enabled, 2. a standard D flip-flop 173 arranged in the shift chain that can be written to '1'or '0' by the monitoring computer (MC) for the purpose of controlling whether the channel is enabled to or disabled from generating a breakpoint trigger pulse 176, 3. a monitorable flip-flop (MFF) 174 arranged in the shift chain that can be read by the monitoring computer (MC) for the purpose of enabling the monitoring computer (MC) either to read the level of the breakpoint trigger signal 175 associated with that channel, or to read whether a breakpoint trigger pulse 176 has been produced by the channel in the last enabled user program circuit (UPC) clock period, the alternatives being selected by the state of flip-flop 173.

4. a monitorable flip-flop (MFF) 177 arranged in the shift chain that can be written and read by the monitoring computer(MC). Its primary purpose is to assist in the generating of a one clock period breakpoint trigger pulse 176 on the selected transition of the breakpoint trigger signal 175 associated with that channel when enabled.

The D flip-flop 172 is connected to one input of a 2 input XNOR gate 178 with the channel breakpoint trigger signal 175 connected to the other. Setting the flip-flop to '0'or to '1' causes the XNOR gate to pass the breakpoint trigger signal either inverted or non-inverted respectively. The transition sensing circuit is arranged to generate a breakpoint trigger pulse 176 when the signal on the output of the XNOR gate goes from '0'to '1', so writing to the D flip-flop 172 allows the monitoring computer (MC) to control which transition of the channel breakpoint trigger signal 175 will generate the pulse.

The signal from the XNOR gate 178 is passed to the D input of the monitorable flip-flop 177 via a two input AND gate 179 controlled by a signal 180 that gates it through only during the user circuit enable (UCE) time intervals. Signal 180 is the same signal shown as signal 19 in FIG. 3, and is not qualified by Break 27 as is signal 33, because the circuit is required to operate during the additional clock cycle that the AND gate generating signal 33 is designed to suppress when a break condition is generated. Flip-flop 177 is also clock enabled by signal 180. Flip-flop 174 is also clock enabled by signal 180 when the channel enable flip-flop 173 is set to '1', enable.

The only difference between signals 19 and 33 is that signal 33 is shortened by one clock cycle when a breakpoint is triggered, otherwise the signals are identical.

The user program circuit (UPC) uses signal 33 as its user circuit enable (UCE) signal, which is its logic processing interval (LPI) clock enable signal. The breakpoint channel circuits, which interface between the user program circuit (UPC) and the remainder of the system circuits such as the user program manager (UPM) state machine, use signal 19 to enable their operation during a logic processing interval (LPI). The use in the breakpoint channel circuits of monitorable flip-flops (MFFs), which are primarily used in the user program circuit (UPC), arises due to the inclusion of the breakpoint channel circuit flip-flops in the shift chain.

When enabled during logic processing intervals (LPIs), the Q output of flip-flop 177 is the same as its D input except it is delayed by one user circuit enabled clock cycle. Feeding the signal on the D input 181 and the inverted signal from the Q output 182 to an AND gate 183 results in the AND gate outputting a breakpoint trigger pulse on signal 176 lasting one clock cycle each time the D input goes to '1' from '0'. Further, feeding the level from the D flip-flop 173 to a third input on the AND gate 183 allows the monitoring computer to enable or disable the generation of the pulse, thereby enabling and disabling the channel.

The final flip-flop 174 is arranged with two two-input multiplexers 184 and 185 so that it may either sample the breakpoint trigger signal 175 coming into the channel, or sample the breakpoint trigger pulse 176 generated by the three input AND gate 183, and these values can then be read by the monitoring computer (MC) via the shift chain. Signal selection is controlled by the D flip-flop 173 as a secondary function in addition to its primary function of disabling or enabling the channel. This is convenient because the monitoring computer needs to read the level of the breakpoint trigger signal coming into the channel when this flip-flop is disabled before the start of a run and read the breakpoint trigger pulse 176 from the three input AND gate 183 when the channel is enabled during a run.

Multiplexer 184 feeds the D input 186 of the monitorable flip-flop 174 with the breakpoint trigger pulse signal 176 when the channel is enabled, and when the channel is disabled with the breakpoint trigger signal 175.

Multiplexer 185 feeds the clock enable input 187 of the monitorable flip-flop 174 with non-truncated user circuit enabling signal 180 when the channel is enabled, and when the channel is disabled with a specially timed sampling signal 188 called the tap clock enable (TCE).

The tap clock enable signal (TCE) 188 is generated by a simple modification of the User Program Manager (UPM) state machine of FIG. 4. The signal is arranged to occur for one clock cycle only immediately after each time the UPM user circuit enable signal 19 goes to '0' from '1'. Signal 19 is driven by the port UPCEnable defined in the VHDL code of FIG. 4. By enabling the flip-flop 174 using the tap clock enable signal 188, the flip-flop can be made to sample the state of the breakpoint trigger signal level 176 at the correct time, after it has settled following the completion of the logic processing interval (LPI) and prior to its value being read by the monitoring computer (MC) during the next data access interval (DAI).

For clarity, FIG. 21 does not show connections for initializing the flip-flops after the PLD configuration bit pattern is downloaded. It may be convenient to connect these to initialize to a circuit state of:

flip-flop 172, '1', select transition '0' going to '1',
flip-flop 173, '0', disable channel,
flip-flop 174, '0', but writing a value to this effectively read-only bit has no effect on circuit operation,
flip-flop 177, '1', breakpoint pulse locked out, however, initializing is not vital as the monitoring computer (MC) itself will want to establish a suitable known breakpoint channel circuit state before running the user program circuit for the first time after download into the PLD.

The remaining features of FIG. 21, not yet described, relate to the shift chain, which is of the serial shift register type, by which the monitoring computer reads and writes the various flip-flops. The features and key points are:

signal 189, which is the master clock signal that times the operation of the complete system including the user program circuit (UPC). This is same signal shown as the clock signal 24 in FIG. 3, and declared as port Clock in the VHDL of FIG. 4.

signal 190, is the shift chain enable (SCE) signal, shown on FIG. 3 as signal 35 and in the VHDL as port ShiftChainEnable. The user program manager (UPM) only allows one of the three signals: either the non-truncated user circuit enable signal 180 shown as 19 in FIG. 3, or the shift chain enable (SCE) signal 190, or the tap clock enable signal (TCE) 188, to be true ('1') at any one time, thus either enabling data to be shifted through the shift chain or enabling the monitorable flip-flops (MFFs) to operate independently of the shift chain, at different mutually exclusive times.

signal 191 is the shift data input signal for the section of the shift chain in the channel circuit, and originates from the output of the previous section of the shift chain.

signal 192 is the shift data output signal for the section of the shift chain in the channel circuit, and delivers data to the shift data input of the next section of the shift chain.

the shift chain shift data connections within the channel can be seen at 193, 194, and 195.

As an alternative to the full management of the flip-flop 172 by the monitoring computer as described, those skilled in the art will also easily see how, if considered advantageous, the transition polarity selecting flip-flop 172 may have its state automatically reversed each time its associated breakpoint trigger signal 175 generates a breakpoint trigger pulse 176, as is required for continued trigger monitoring.

Commissioning a User Program Circuit

The user has the following facilities to help debug and commission a user program circuit (UPC). They may:

use single stepping and breakpoints to run the user program circuit (UPC) and control it, and observe user program circuit (UPC) signals and circuit values and modify them by forcing or changing stored values, record and display waveforms on the monitoring computer (MC) as they develop, either as the user program circuit (UPC) is single stepped, or as it runs for the number of cycles nominated by the user via the monitoring computer (MC). As is normal practice in the industry with this type of display, waveforms of multiple related signals, such as an address bus, can be displayed in a suitable numerical, character based or symbolic form.

Controlling Logic Settling Times

The user program circuit (UPC) is implemented using logic as described in the section Synchronous Logic Above.

Figure 16:
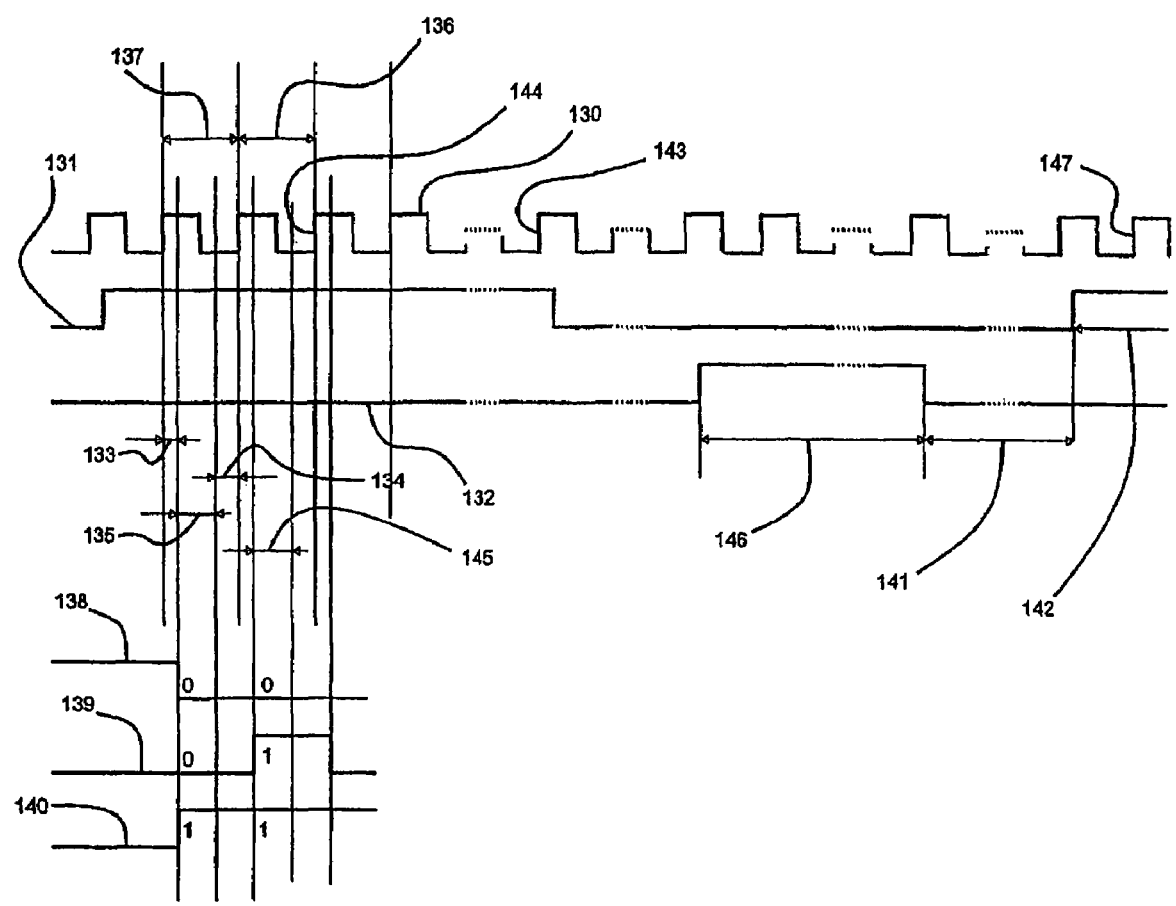
FIG. 16 is a waveform diagram illustrating continuous run mode, the logic processing interval (LPI) and the data access interval (DAI).

FIG. 16 shows waveforms associated with normal monitored semi-continuous run operation. The clock 130 runs continuously, and the associated active clock transitions (ACTs), for example 144, are the positive going edges.

The user program circuit (UPC) is enabled for active clock transitions (ACTs) during the logic processing interval (LPI) which is when the UPCEnable signal 131 is high (true). The ShiftChainEnable signal 132 goes high (true) during the data access interval (DAI). Logic processing intervals (LPIs) and data access intervals (DAIs) alternate repeatedly. Between each logic processing interval (LPI) and data access interval (DAI) is a period of time, which is much longer than the time normally available for the logic to settle, when neither UPCEnable nor ShiftChainEnable is high. This period corresponds to the time taken for the user program manager (UPM) state machine to change its active state from the state controlling the logic processing interval (LPI) to the state(s) controlling the data access interval (DAI) and vice-versa. The dotted lines in FIG. 16 indicate continuance for an undefined number of clock cycles wherein the clock continues with the same waveform and at the same frequency, and the other signals continue at the indicated levels.

Any individual logic processing interval (LPI) active transition interval (ATI) can be divided into three separate time intervals shown in FIG. 16:

- the active clock transition (ACT) to Output Interval 133, which is the time interval starting at the active clock transition (ACT) at the start of the active transition interval (ATI) and ending when the affected flip-flop outputs have settled to a stable value,
- the Setup Time Interval 134, which is the time interval ending at the next active clock transition (ACT), and starting just sufficiently prior to the active clock transition (ACT) to allow the associated flip-flops enough setup time to operate correctly, and
- the Logic Settling Interval 135, which is the remaining time interval between the two intervals described above.

Of the three time intervals, only the Logic Settling Interval 135 varies with clock frequency, as the other two intervals are basic characteristics of the programmable logic device (PLD) used.

In a user program circuit (UPC), each run mode active transition interval (ATI), for example, ATI, 136, and the run mode active transition interval (ATI) prior to it, ATI, 1137, are characterized by the particular pattern of '1's and '0's, denoted as $P_n$ and $P_{n-1}$ representing the settled output levels for the user program circuit (UPC) flip-flops for each active transition interval (ATI) respectively, and determined by the operation of the circuit and the circuit stimuli. An example of such a pattern is shown in FIG. 16, but for three flip-flop output signals only for brevity's sake. As shown in time interval 145 the pattern $P_n$ for output signals 138, 139 and 140 is 0, 1, 1 respectively, and in time interval 135, the pattern $P_{n-1}$ is 0, 0, 1. These patterns represent the state data for the three flip-flops, and each can be thought of as patterns characteristic of any one logic processing interval (LPI) active transition interval (ATI) ($P_n$) and that prior to it ($P_{n-1}$).

When the user program circuit (UPC) processing is enabled and totally continuous without monitoring interruptions, logic level changes on the outputs of the flip-flops resulting from each active clock transition (ACT) have only a single Logic Settling Interval, for example 135 or 145, during which to settle prior to the next enabled active clock transition (ACT).

When the user program circuit (UPC) processing is enabled but not totally continuous because monitor cycles are occurring, logic levels throughout the combinational logic settle under different conditions.

The user program circuit (UPC) flip-flop output levels generated by the last active clock transition (ACT) in any one logic processing interval (LPI), for example 143, are those that, once they have propagated through any intervening combinational logic to the following flip-flops, will be sampled by the first active clock transition (ACT) in the next logic processing interval (LPI), for example 147.

The monitorable flip-flops (MFFs) in the user program circuit (UPC) as so far described, will have their states disturbed during the data access interval (DAI), for example 146, due to the shift chain operation, but will all be restored and loaded with the correct state data when data accessing is complete some clock cycles before the next logic processing interval (LPI) active clock transition (ACT). The user program circuit (UPC) state data will not change during the interval 141 between the data access interval (DAI) 146 and logic processing interval (LPI) 142 because neither the UPCEnable nor the ShiftChainEnable levels are true and all the monitorable flip-flops (MFFs) are disabled.

Combinational logic output signals resulting from monitorable flip-flop (MFF) output levels generated by the last active clock transition (ACT) in an logic processing interval (LPI) therefore have a significantly longer time to settle and stabilize, at least several clock cycles, before being sampled than if the generating active clock transition (ACT) had not been the last in the logic processing interval (LPI), when there is only a single Logic Settling Interval.

Figure 17:
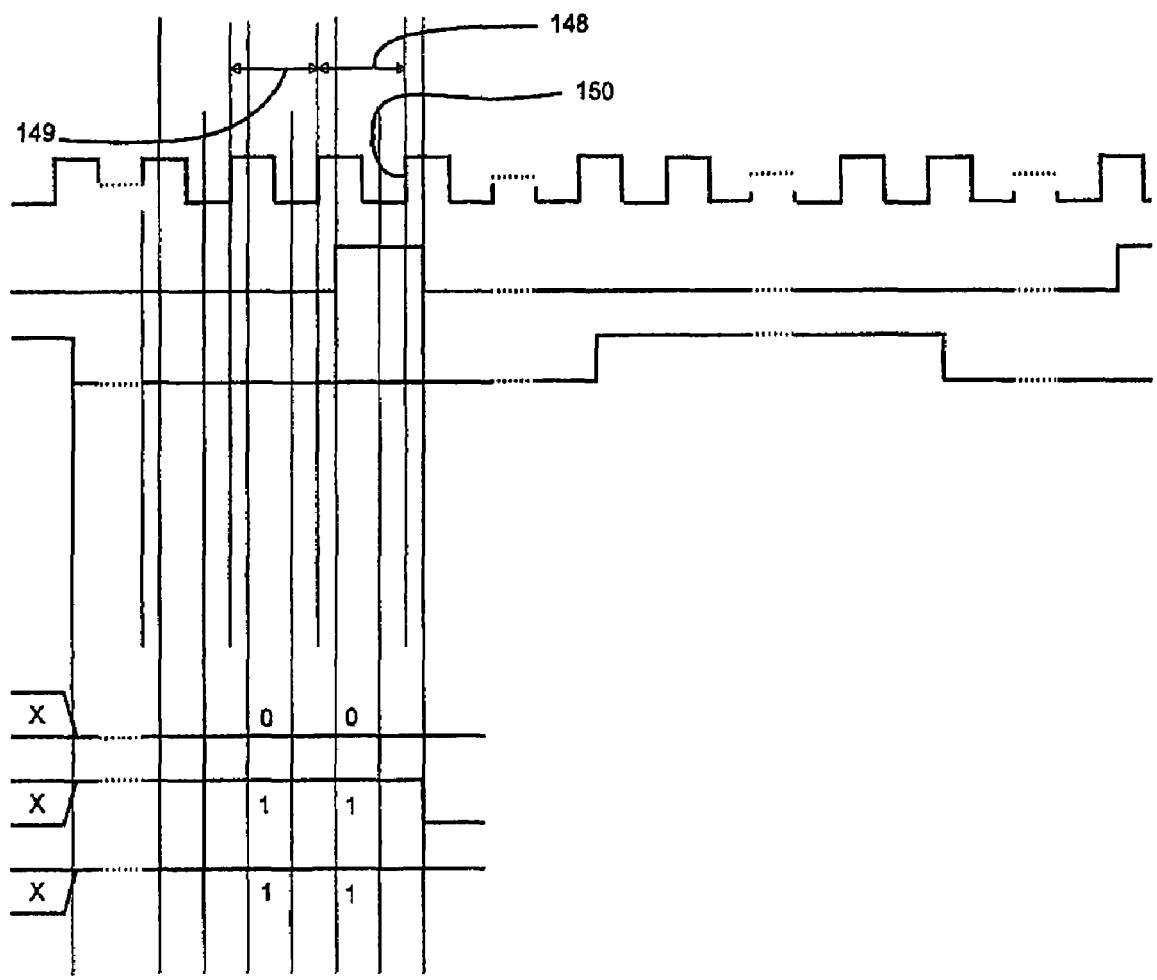
FIG. 17 is a waveform diagram illustrating single step mode with logic settling conditions different to continuous run mode.

FIG. 17 shows waveforms applicable to single stepping. Single step mode is of course an extreme case where every logic processing interval (LPI) active clock transition (ACT) is both the first and the last in the logic processing interval (LPI), because each logic processing interval (LPI) is only one active transition interval (ATI) long.

Comparing FIG. 17 and FIG. 16, we can see that

Active transition interval (ATI) 148 corresponds to active transition interval (ATI) 136 and the UPCEnable signal is true in both, The logic vector, pattern 0,1,1 ($P_n$) applies to both, and will be sampled on clock edges 150 and 144 respectively, Active transition interval (ATI) 149 corresponds to active transition interval (ATI) 137, but the logic patterns are different.

In active transition interval (ATI) 137, the pattern $P_{n-1}$ is the resultant of the sampling by the logic processing interval (LPI) active clock transition (ACT) at the start of 137, however, in active transition interval (ATI) 149 we see the same pattern as 148, the result of the data restoration at the end of the data access interval (DAI), rather than sampling during the previous logic processing interval (LPI) active clock transition (ACT). The previous logic processing interval (LPI) active clock transition (ACT) is of course some significant time before, and prior to the data access interval (DAI).

Not only does $P_n$ in FIG. 17 have longer to settle, but it settles from different values because the previous values were due to the shift chain operation, not $P_{n-1}$, and therefore must be treated as unknowns. This is not however significant with the settling times involved.

This effect does not harm normal circuit operation, because the correct data values are always present when required for sampling. It does, however, hinder the use of the single step mode for test purposes if we want to be able to single step a circuit and have the circuit perform identically to the way it would perform in the totally continuous run mode. Maximum allowable clock speed testing requires that the circuit starts to malfunction at the same marginal active transition interval (ATI) value as we progressively increase clock speed and reduce the active transition interval (ATI) available, whether in continuous run or single step. Means, additional to those described prior to this point in the specification, are therefore included to ensure that logic settling conditions are the same whether the user program circuit (UPC) is single stepping or running totally continuously.

So that continuous run and single step logic settling conditions are sufficiently identical for our purpose, we ensure that:

1. when the user program circuit (UPC) is enabled in run and single step modes, the corresponding active transition intervals (ATIs) are of equal length,
2. the flip-flop output pattern applied to the combinational logic at the start of the single step logic settling interval logic processing interval (LPI) is the same as the corresponding pattern in continuous run mode, and
3. the flip-flop output pattern applied to the combinational logic at the start of the logic settling interval in the active transition interval (ATI) immediately prior to the single step logic processing interval (LPI) active transition interval (ATI) is the same as the corresponding pattern in continuous run mode The first criteria is complied with because we have control of the clock frequency. The second is complied with because the principles of operation of the invention provide compliance, even if settling times are not required to be identical in both run and single step mode. The additional means are required to meet the third criteria.

Figure 18:
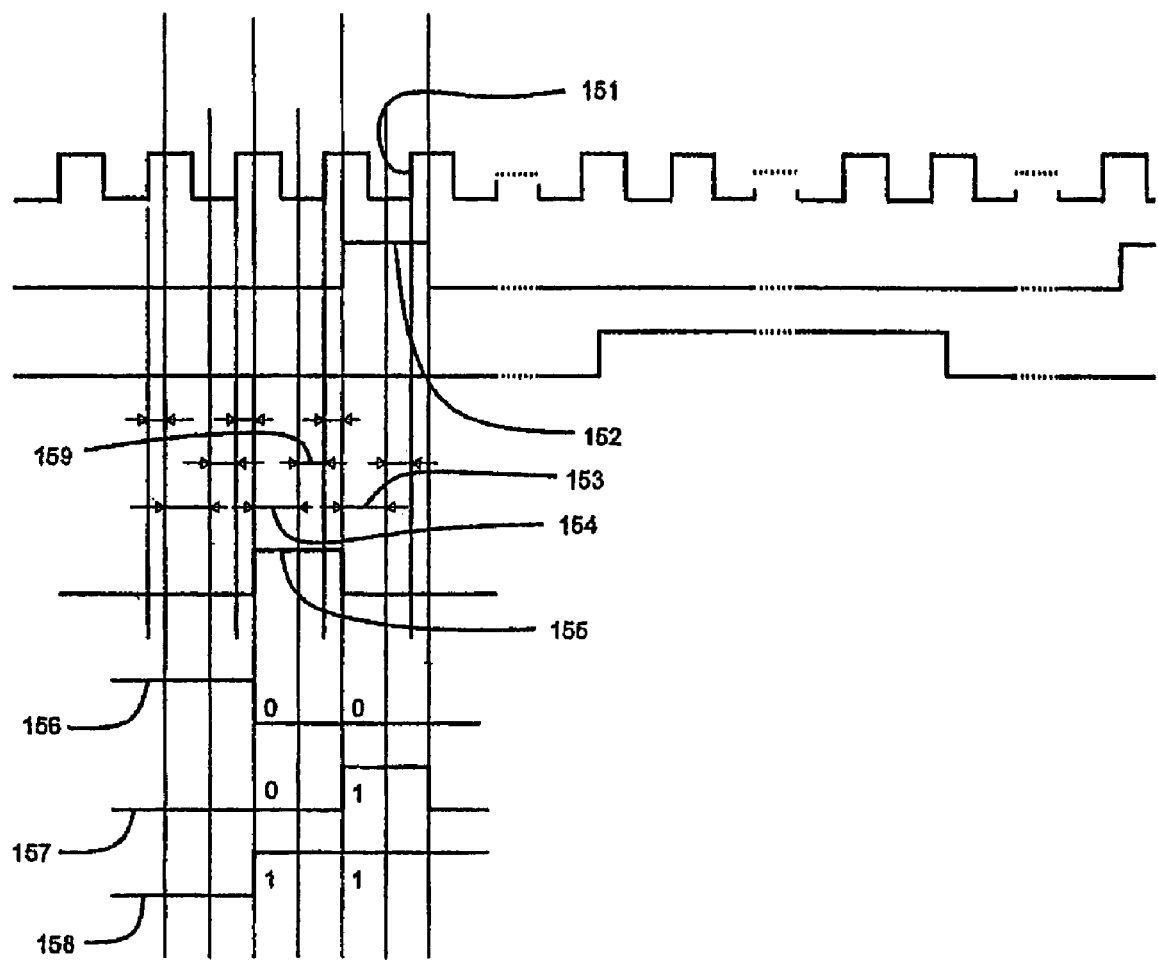
FIG. 18 is a waveform diagram illustrating single step mode with logic settling conditions arranged to be the same as continuous run mode.

Referring now to FIGS. 16 and 18, the features of the continuous run mode and single step waveforms that correspond to each other, and that are important to the description:

The logic processing interval (LPI) active clock transition (ACT) 151 in single step mode corresponds to 144 in run mode,
the logic settling time 153 in single step mode corresponds to 145 in run mode,
the logic settling time 154 in single step mode corresponds to 135 in run mode,
the flip-flop output levels 156, 157, 158 in single step mode correspond to 138, 139, 140 in run mode and are shown as having the same values at the same corresponding times.

As has been described, the logic patterns during intervals 145 and 153 are maintained the same by the operation of the circuits so far described, by virtue of the fact that after a rotation of the shift chain, the original user program circuit (UPC) state data from the end of the last logic processing interval (LPI) is intentionally returned to its original position in the user program circuit (UPC) for the start of the next logic processing interval (LPI). That is, unless it has been modified by the monitoring computer (MC), which of course would be an intended and acceptable situation.

The logic patterns during intervals 135 and 154 represent a different case. The logic pattern in interval 135 represents the user program circuit (UPC) state data one logic processing interval (LPI) active clock transition (ACT) before that of interval 145. In continuous run mode these waveforms are generated naturally by the circuit operation.

We have already described how the lack of enabling levels maintains flip-flop outputs stable between each data access interval (DAI) and the next logic processing interval (LPI), so the levels of waveforms 156, 157, 158 to the left of interval 153 in FIG. 18, left to themselves, would show no transitions and be horizontal lines.

In order to achieve identical operation we must provide a circuit to load the values shown in interval 154 so that the user program circuit (UPC) combinational logic can settle during 154, and the flip-flop inputs can be sampled at the end of 159.

Figure 19:
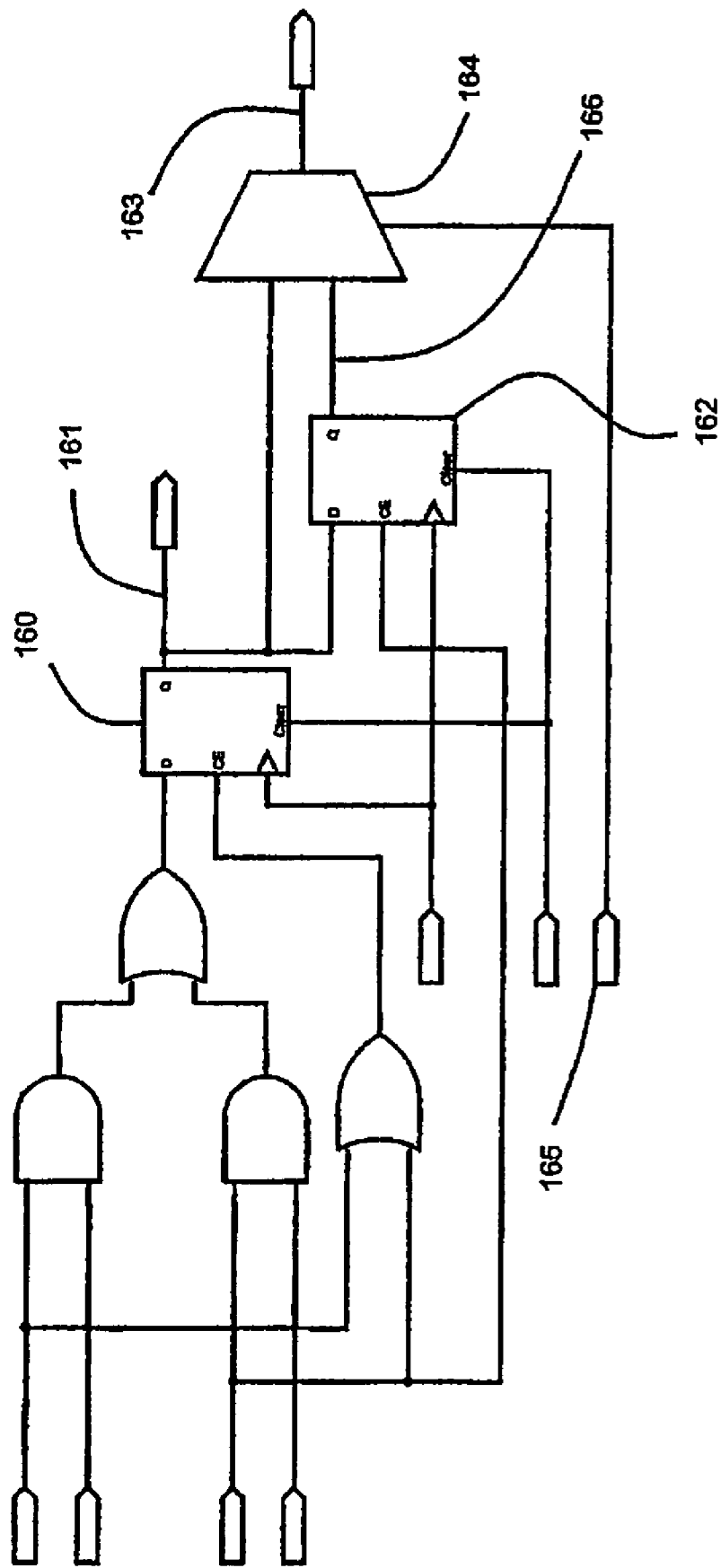
FIG. 19 is a schematic of a monitorable flip-flop (MFF) similar to FIG. 6, but without the limitation in functionality that logic settling conditions in single step mode will be different to continuous run mode.

The PreloadEnable signal 155 is provided by the user program manager (UPM) state machine to enable the correct values to be inserted by a multiplexer onto the inputs to the user program circuit (UPC) combinational logic. The values required for insertion are those that existed on the outputs of the corresponding user program circuit (UPC) monitorable flip-flops (MFFs) just prior to the last logic processing interval (LPI) active clock transition (ACT), and so if the user program circuit (UPC) monitorable flip-flop (MFF) outputs are sampled and stored every logic processing interval (LPI) active clock transition (ACT) the stored values will always automatically be the values required for insertion. FIG. 19 shows the circuit of FIG. 6 suitably modified to add the sampling, storage and multiplexing.

In FIG. 19:
flip-flop 160 corresponds to flip-flop 43,
output 161 corresponds to output 44,
output 163 corresponds to output 49,
flip-flop 162 samples and stores the output of flip-flop 160, but only every logic processing interval (LPI) active clock transition (ACT), and not during the data access interval (DAI), and
multiplexer 164 is arranged to pass the output signal 161 from flip-flop 160 on to output 163 unless the PreloadEnable signal applied to its select line 165 is true, in which case it selects the output of flip-flop 162 to pass on to output 163.

In this way, the required flip-flop output pattern is applied to the combinational logic at the start of the logic settling interval in the active transition interval (ATI) immediately prior to the single step logic processing interval (LPI) active transition interval (ATI), and the logic settling conditions in continuous run and single-step modes are made sufficiently identical. Other minor effects with regard to timing can be handled by the safety margin discussed.

There are costs, trade-offs and variations in testing requirements that suggest a range of solutions may be more appropriate than a single fixed solution:

Adding flip-flop 162 to each monitorable flip-flop (MFF) doubles the number of flip-flops used in any particular user program circuit (UPC), and it may therefore be desirable to make the inclusion of flip-flop 162 an option to be applied only when required for testing to standardize run mode and single step timing.

In circumstances in which the monitoring computer (MC) has access to the state pattern $P_{n-1}$, which is the state pattern prior to the current state pattern, as it does during the maximum allowable clock speed testing process to be described later in this specification, Pn the current pattern may be regenerated in a way that limits its settling time to within a single active transition interval (ATI) only. This is done by loading the Pn-1 state pattern during a data access interval (DAI), and then activating the user circuit enable (UCE) signal during the preload cycle immediately prior to the single logic processing interval (LPI) cycle that performs the single step. This process uses the monitorable flip flop of FIG. 6, rather than of FIG. 19, and causes the user program circuit (UPC) states to be $P_{n-1}$, $P_n$, and $P_{n+1}$ during three consecutive clock cycles as required.

The process is one of setting the circuit state one step back, and then stepping it two steps forward to achieve a total advance of a single step whilst restricting settling time. Special arrangements must be made for the first single step after either a circuit initialization or a multi-step run, because Pn-1, which is either the state pattern prior to the initialization state pattern or the pattern prior to the end pattern from the multi-step run, does not exist or is not known. The user circuit enable (UCE) should not therefore be activated during a first single step preload cycle, and the method is subject to this limitation. But by using the monitorable flip-flop of FIG. 6 rather than of FIG. 19 this process eliminates the need for additional state storage (the extra flip-flop in FIG. 19) and thereby allows a considerably larger user circuit in any particular programmable logic device (PLD).

It may simplify testing in some circumstances to enable the user to personally enter the logic levels to be applied during the Preload active transition interval (ATI). This may be advantageous in that it may enable the user to apply known worst case conditions. In this case, the flip-flop 162 can be omitted, and the multiplexer input 166 driven from a Forcing Buffer, or some similar manner.

Another useful alternative can be provided by omitting the flip-flop 162 and multiplexer 164, and driving the output 163 with a two input XNOR gate with one input driven from signal 161 and the other from signal 165. The effect is to invert the output signal 163 during the time that the PreloadEnable signal 165 is true, and therefore to guarantee transitions on all signals into the combinational logic at the beginning of the Logic Settling Interval prior to the single-step logic processing interval (LPI) active clock transition (ACT).

While this technique guarantees signal activity, it does not guarantee worst case settling conditions, however it does provide a method of flushing out a proportion of timing problems with a low cost in extra logic and effort.

It has been shown how circuits can be built into monitorable flip-flops (MFFs) to work with the PreloadEnable signal to control combinational logic settling conditions in single step mode. Such circuits can also be provided in a form allowing the user to add them explicitly to user program circuit (UPC) schematics as appropriate symbols, and the monitoring computer (MC) can automatically make the necessary connections to standard signals such as PreloadEnable. We will discuss one such circuit later on, a Preload Buffer usable with either fixed level inputs or inputs provided by Forcing Buffers.

Determining Maximum Allowable Clock Speed for Error Free Operation

Requirement and usage

As the PLDPC is designed for reliable maximum speed operation while at the same time eliminating the need for simulation including timing simulation, albeit predominantly for small volume applications, one aspect of this invention is the provision of a self contained automated test method for determining the maximum allowable clock speed for correct operation.

The test method used results in a measure of the performance of the individual piece of hardware on which the test is performed and in the conditions under which it was performed, rather than, as in the case of simulation based design, a necessarily conservative estimate of the level of performance that can be expected from any hardware complying with the specifications applicable to the simulations. This is a significant difference which provides a useful choice particularly to users who need to implement one-off or small numbers of systems working at maximum performance.

It is of course recognized that system response speeds vary dependent on various operating conditions such as for example temperature and supply voltage. The user should perform testing under worst case temperature and supply voltage conditions or apply adjustments to allow for any such variables. A safety margin should also always be allowed to provide for inherent variability of circuit elements, variability test run to test run, and over time. The safety margin should be determined based on experience with particular hardware systems due to its dependence on many factors, for example clock jitter.

Recording the tests with all associated initial conditions and reference responses enables the tests to be run on multiple PLDPCs, each with the same circuit loaded and under the same conditions. Each test can be applied and reported automatically and the batch of PLDPCs characterized.

Testing with Variable Logic Settling Times and Clock Frequency

For a synchronous circuit, as previously described, to operate correctly, the whole circuit must change state and settle to stable levels between one active clock transition (ACT) and the next with sufficient margin such that it does not breach the setup and hold time requirements of the flip-flops. It can be assumed that for the case of a suitable programmable logic device (PLD), the hold time requirement will be met in the circumstances described, but the test method to be described would detect any such errors in any case.

The test method used consists of:
running the user program circuit (UPC) with extended logic settling times to make a record of correct user program circuit (UPC) operation as a reference by recording the full user program circuit (UPC) state data both prior to and after the application of each logic processing interval (LPI) active clock transition (ACT), and then
testing the user program circuit (UPC) by comparing the reference data with test data observed during test runs with progressively reduced settling times produced by increasing the clock frequency.

An extended logic settling time may be provided either by reducing the clock frequency or by single stepping without the preload function enabled.

Any difference between the reference and test data, either single or multiple bit, indicates a test failure. The monitoring computer (MC) can automatically apply the tests at different clock frequencies required, and record and report the results.

Recording Test Stimuli

As a first step, the user defines sets of user program circuit (UPC) stimulus conditions that can be expected to lead to worst case settling times, in a similar way to how they would define the stimuli with which to simulate a circuit if using the simulation method of design implementation. The set of initial stimulus conditions are used for both the reference and subsequent test runs.

To record the set, the monitoring computer (MC) provides a special Record Test Run mode of operation, operating with the above mentioned extended logic settling times, whereby the user forces or sets necessary initial circuit conditions for each test. Preload Buffers to be described may also be used.

The user can drive a signal from a level, the resultant of a logic expression or a clocked pattern by driving Forcing or Preload Buffer inputs from a suitable source. Forcing buffers allow sections of the circuit to be isolated for separate tests. Test vector stimuli may also be generated as convenient by user defined generators.

When the initial conditions are set, the user single or multiple steps the user program circuit (UPC) and full sets of user program circuit (UPC) state data are recorded by the monitoring computer (MC) before and after each logic processing interval (LPI) active clock transition (ACT). The resultant stimuli and responses associated with each logic processing interval (LPI) active clock transition (ACT) can be observed with the waveform display during the recording process and then saved on the monitoring computer (MC) under a user-chosen name. Because the response produced by one logic processing interval (LPI) active clock transition (ACT) is also the stimulus for the next when multiple steps are taken, it is of course not necessary to record the redundant data.

At this point, the monitoring computer (MC) has a set of initial states for the user program circuit (UPC), which if applied prior to a single logic processing interval (LPI) active clock transition (ACT) will each produce an associated known response providing that the user program circuit (UPC) operates error free.

Preload Buffer Circuit

Figure 20:
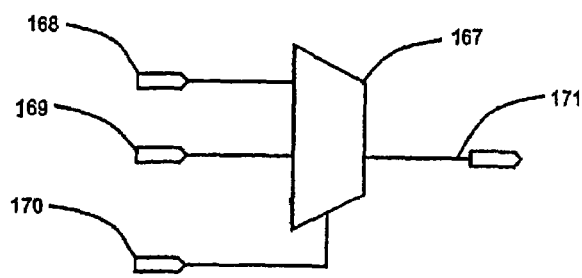
FIG. 20 is a schematic of a preload buffer.

FIG. 20 shows the internal circuit for the Preload Buffer, which is very simple and consists of just a two input multiplexer 167 properly connected.

Preload Buffer signal 170 selects between signals 168 and 169, connecting the selected signal to output 171. Signal 170 is driven from signal PreloadEnable 34. PreloadEnable is true for one clock cycle before each time that UPCEnable goes true. When PreloadEnable is true it selects signal 168 otherwise signal 169 is selected.

FIG. 12 shows how Forcing and Preload Buffers may be used in a user program circuit (UPC). Block 94 is a circuit block consisting of combinational logic only, and having inputs 99, 100 and 101. Block 94 has a single output of concern 102 driving another circuit block 95. If it is suspected that the maximum settling for a circuit under test is caused when signal 101, normally driven by Pin 98, goes from '1' to '0', the user can proceed as follows—

A preload Buffer 91 is inserted into signal line 101 with the buffer output 105 driving signal 101, and the buffer input 104 driven by Pin 114.

A Forcing Buffer 93 is next inserted into the signal line coming from Pin 98. It may be set to provide a forced output '0' or to pass the input level by putting the switch toggle in the centre position, whichever condition best suits the user's test strategy.

A Forcing Buffer 92 driven from a Pin 97 is provided to drive the Preload Buffer PreloadIn Pin 103. It is set to provide a forced output '1', and has an input level indicator 108.

A level display 96, enabled by the UPCEnable signal, is provided and the whole circuit will now be as shown in FIG. 12.

If the circuit is now run by single stepping, the following sequence of operations occurs:

A single PreloadEnable clock cycle occurs switching the '1' level from buffer 92 via buffer 91 onto signal line 101, then immediately after, a single UPCEnable clock cycle occurs switching the '0' or circuit defined level from buffer 93 via buffer 91 onto signal line 101.

various data access interval (DAI) related cycles occur during which the monitoring computer (MC) accesses the user program circuit (UPC) state data via the shift chain The procedure described ensures that the signal only has one active transition interval (ATI) in which to settle, even though the UPCEnable signal only comes true for one clock cycle at a time, each time many clock cycles apart.

Test Sequence

A test, automatically controlled by the monitoring computer (MC), consists of:

loading a full set of stimulus initial conditions in the form of state data into the circuit under test, single-stepping the user program circuit (UPC) by applying one logic processing interval (LPI) clock cycle with one active clock transition (ACT) while using preload means to ensure that the same signal pattern changes will occur, and that the logic will have the same settling time, as would be the case in continuous run mode, reading a full set of resultant state data out of the circuit under test, recording any error indicated by unequal bits in the reference and resultant state data and repeating the above for each of the initial and resultant sets of state data making up the test sequence.

Error Isolation

The system described enables good error detection by:

isolating errors down to the individual flip-flop level, and identifying multiple errors in a single test sequence.

Being able to check the state of all and every monitorable flip-flop (MFF) in the user program circuit (UPC) enables the monitoring computer (MC) to isolate failures to individual combinational logic networks driving individual monitorable flip-flop (MFF) inputs, and to the test cycle of concern.

Loading a full set of initial state data for each logic processing interval (LPI) clock cycle, instead of starting the next test with the state data produced by the last, and doing so even if the cycle was recorded as part of a multi-cycle test, allows the system to check for correct operation during each cycle of the multi-cycle test, even if some previous cycles had exhibited incorrect behaviour. This method provides maximum information by allowing the system to report system performance cycle by cycle for all planned test cycles, and to report in terms of all the bits in all the components that failed in each cycle that exhibited incorrect behaviour.

A minor limitation of the method occurs when two errors exist in consecutive logic processing interval (LPI) active transition intervals (ATIs). Whereas the correct state data pattern will be loaded from the monitoring computer (MC) for the single step logic processing interval (LPI) active transition interval (ATI), the data for the preload active transition interval (ATI) will be that which was stored in the logic processing interval (LPI) active transition interval (ATI) prior to the preload cycle, and this may have an adverse effect on the settling of the data for the single step logic processing interval (LPI) active transition interval (ATI). While this effect might cause an error to go undetected, it only occurs subsequent to the first error being detected in a run, and so cannot go undetected altogether providing the user adopts the good practice of requiring at least one error free test run before approving operation. The limitation is considered minor for this reason.

HDL Output

A computer is programmed to generate a description of the user program circuit and control circuits thus arranged. The description may be, for example, a hardware description language version of the combined circuits. This description may subsequently be compiled into a bit pattern for programming the PLD. Alternatively the compiler may be integrated, so that the description is the bit pattern for programming the PLD.

In addition to the above, the computer may be programmed to generate a hardware description language version of the user program circuit, excluding the control circuit. That is, the computer may generate a circuit excluding features only required to support the monitoring computer monitoring functions and the various control circuits. This version of the user program circuit may be used for compiling or simulating equivalent circuits without the monitoring functions.

I claim:

1. A programmable device useful for high speed operation or as a process controller, for which the item under control may consist of plant, machinery, peripheral electrical or electronic circuits or other automated systems, or useful as a component for implementing PLD or FPGA applications, said programmable device including:

at least one input interface and an input register for connection to the item under control to provide sampled and stored input data in digital form, at least one output interface and an output register for connection to the item under control to receive and store output data in digital form, programmable logic hardware including a plurality of basic logic elements and electrically configurable interconnections, said interconnections configurable to interconnect the logic elements as a user control program circuit and to connect the user control program circuit to said input and output interfaces, program loading circuits enabling the user to configure the programmable logic hardware with a user program circuit prior to commencing control, said user program circuit having a plurality of state data storage units storing the user program circuit state data, wherein said programmable device when configured contains a user program circuit interfaced to a control circuit, said control circuit operating synchronously with the user program circuit, said control circuit is able to:

communicate with a monitoring computer to respond to commands, operate when commanded to cause the user program circuit to run, or pause, or single step, read data values from said state data storage units, and write data values to said state data storage units.

2. The programmable device as claimed in claim 1 wherein said control circuit is able to pause the user program circuit in response to a signal originating in the user program circuit effective before the next active clock transition.

3. The programmable device as claimed in claim 2 wherein said control circuit is configured into the programmable logic hardware together with the user program circuit, and wherein said programmable device has an operating cycle of at least two non-overlapping sequential intervals including a logic processing interval and a data access interval, each interval consisting of one or more clock periods, and within said logic processing interval an input data register operates to sample and store input data, and the user program circuit operates to update its state data and allow resultant combinational logic values to settle, and an output data register operates to latch and store the output data, and within said data access interval said control circuit is able to read and write the user program circuit state data and cause control functions to be performed.

4. The programmable device as claimed in claim 3 wherein said programmable device includes circuitry for selecting a clock frequency of the programmable logic hardware from a range of values.

5. The monitoring computer for use with a programmable device as claimed in claim 4, said monitoring computer programmed to store a known good reference set of user program circuit state data response patterns representing correct circuit operation generate a test set of user program circuit state data response patterns representing actual circuit operation under the same circuit initial and stimulus conditions as the said reference set, but generated at a selected clock frequency, compare said reference set of user program circuit state date response patterns with said test set of user program circuit state data response patterns, such that differences in the patterns indicate incorrect circuit operation, and repeat the tests and comparisons using different clock frequencies until the maximum allowable clock frequency at which the user program circuit will operate correctly has been found, said monitoring computer enabling the measurement of the maximum clock frequency at which the user program circuit will run without error.

6. The monitoring computer as claimed in claim 5, programmed to:

generate a set of user program circuit state data response patterns at a selected clock frequency, said circuits and/or software using single stepping techniques enabling reading of the response pattern resulting from each step prior to the next step, control the state data delivered to the combinational logic networks in the user program circuit to ensure that the user program circuit logic settles with a first pattern during the test cycle settling time, preceded by a second pattern in the clock cycle preceding the test cycle, the first and second patterns being the same patterns as would have occurred if the test were performed, with the same user program circuit state data changes, in a single logic processing interval in continuous run mode, and ensure the logic settling times, which influence the user program circuit state data response patterns generated, have substantially the same values under the single stepping test conditions as would have occurred if the test were performed, with the same user program circuit state data changes, in a single logic processing interval in continuous run mode at the clock frequency being tested.

7. The monitoring computer as claimed in claim 5, programmed to:

apply input data, which defines stimulus patterns to the user program circuit, for the purpose of causing the user program circuit to respond as required to enable testing to detect incorrect logic settling, record user program circuit stimulus state data before, and record user program circuit response state data after a logic processing interval active clock transition, as reference data indicative of correct user program circuit operation, by using sufficiently long logic settling times so that the circuit settles so as to meet necessary setup times and operate correctly, and combine said stimulus and response data with other stimulus and response data build a set of data representing a desired test sequence and a known good reference set of stimulus and response patterns.

8. The monitoring computer as claimed in claim 6 wherein said monitoring computer is programmed to identify the location of failure in the user program circuit from the position of a bit that differs when the reference and response state data sets are compared, and indicate to a user the identified location in the user program circuit of each state data bit that fails to operate correctly.

9. The monitoring computer as claimed in claim 6 wherein controlling the delivered state data, and ensuring the logic settling times, includes re-establishing the user program circuit state one step prior to the current state and then stepping the circuit two steps forward in two consecutive clock cycles to achieve a total advance of a single step while restricting the logic settling time to the settling time available between the two active clock transitions associated with the two steps forward.

10. The monitoring computer as claimed in claim 6 wherein controlling the state data delivered, and ensuring the logic settling times, include, at least in part, storing the previous state of at least some state data bits in flip-flops of said program circuit, and multiplexing the previous state data to the associated combinational logic inputs in the clock cycle prior to the single step cycle.

11. The programmable device as claimed in claim 3 including circuitry for detecting transitions on selected signals within the user program circuit including:
   circuitry for selectively performing, for each selected signal, at least one of:
      enabling or disabling the detection of transitions on the signal,
      reading the existing level of the signal,
      selecting the polarity of the transition to be detected, positive going, negative going or both, that will generate a trigger, and
      detecting whether a trigger condition has occurred during the last operational clock cycle; and
   circuitry for allowing settings of said circuitry for detecting transitions, for each selected signal, to be changed by the monitoring computer during a data access interval while the user program circuit continues to operate multi-tasked.

12. The programmable device as claimed in claim 11 including circuits enabling the user program circuit, when running, to be commanded to pause, after the occurrence of a selected transition on a selected user program circuit signal, prior to the next active clock transition.

13. The programmable device as claimed in claim 11 including circuits enabling the user program circuit to be commanded to run totally within a single logic processing interval until the occurrence of a specified transition on a specified user program circuit signal.

14. The monitoring computer for use with a programmable device as claimed in claim 11, said monitoring computer programmed to:
   display one or more user program circuit selected signal waveforms without polling a shift chain, according to transitions occurring on the signal, defining each waveform by the initial waveform level and the cycle counts at which the transitions occur.

15. The monitoring computer as claimed in claim 14 programmed to selectably display the clock cycle counts at which the transitions occur, or their time equivalents.

16. The programmable device as claimed in claim 3 including, for at least part of the user program circuit, circuits for, selectably, either single stepping with adequate time at each step to allow the user program circuit to fully settle, or single stepping with the settling time limited, independent of the duration between steps, to that available within a single active transition interval.

17. The programmable device as claimed in claim 3 wherein said programmable device includes at least one of the following:
   circuits enabling the indicating to the user or to external circuits when said programmable device is in the logic processing interval,
   circuits enabling the saving of the user program circuit state data into a backup memory when main power is lost, and restoring said state data when main power returns,
   circuits enabling the configuring of the programmable logic hardware at power-on including with a user program circuit and other necessary circuits so as to automatically start operation and run the user program circuit,
   circuits enabling the setting of the clock frequency automatically at power-on,
   circuits enabling the making of the user program circuit state data available to Human—Machine Interface systems and Supervisory Control and Data Acquisition Systems, and
   circuits enabling communicating with the monitoring computer via a wired or wireless network capable of supporting communications to more than one device.

18. The monitoring computer for use with a programmable device as claimed in claim 3, programmed to display user program circuit signal waveforms by:
   reading user program circuit state data representing the signals and data to be displayed,
   single stepping the user program circuit , and
   repeating said reading and single stepping for the required number of clock cycles.

19. A system including a programmable device including:
   at least one input interface and an input register for connection to the item under control to provide sampled and stored input data in digital form,
   at least one output interface and an output register for connection to the item under control to receive and store output data in digital form,
   programmable logic hardware including a plurality of basic logic elements and electrically configurable interconnections, said interconnections configurable to interconnect the logic elements as a user control program circuit and to connect the user control program circuit to said input and output interfaces,
   program loading circuits and/or software enabling the user to configure the programmable logic hardware with a user program circuit prior to commencing control, said user program circuit having a plurality of state data storage units storing the user program circuit state data,
   wherein said programmable device when configured contains a user program circuit interfaced to circuits and/or software, said circuits and/or software enabling the operating synchronously with the user program circuit , said circuits and/or software are able to communicate with a monitoring computer to respond to commands, said circuits and/or software are able to operate when commanded to cause the user program circuit to run, or pause, or single step, said circuits and/or software are able to read data values from said state data storage units and to write data values to said state data storage units, said circuits and/or software are able to pause the user program circuit in response to a signal originating in the user program circuit effective before the next active clock transition after that giving rise to the signal,
      said circuits and/or software being configured into the programmable logic hardware together with the user program circuit, and wherein said programmable device has an operating cycle of at least two non-overlapping sequential intervals, each interval consisting of one or more clock periods and during which, within a first said interval (the logic processing interval) an input data register operates to sample and store input data, and also the user program circuit operates to update its state data and allow the resultant combinational logic values to settle, and also an output data register operates to latch and store the output data, and within a second said interval (the data access interval) said circuits and/or software are enabled to read and write the user program circuit state data and cause control functions to be performed, and said programmable device includes circuits for selecting the programmable logic hardware clock frequency from a range of values, for the purpose of accommodating various user program circuit logic settling times; and a monitoring computer including:

circuitss enabling the comparison of a known good reference set of user program circuit state data response patterns representing correct circuit operation with a test set of user program circuit state data response patterns, the test set representing actual circuit operation under the same circuit initial and stimulus conditions as the said reference set, but generated at a different selected clock frequency, such that differences in the patterns indicate incorrect circuit operation, circuits for repeating the tests and comparisons using different clock frequencies until the maximum allowable clock frequency at which the user program circuit will operate correctly has been found, said monitoring computer enabling the measurement of the maximum clock frequency at which the user program circuit will run without error.

20. The system as claimed in claim 19, which includes:

circuits and/or software for generating a set of user program circuit state data response patterns at a selected clock frequency, said circuits and/or software using single stepping techniques enabling reading of the response pattern resulting from each step prior to the next step, circuits and/or software enabling the control of the state data delivered to the combinational logic networks in the user program circuit to ensure that the user program circuit logic settles with a first pattern during the test cycle settling time, preceded by a second pattern in the clock cycle preceding the test cycle, the first and second patterns being the same patterns as would have occurred if the test were performed, with the same user program circuit state data changes, in a single logic processing interval in continuous run mode, and circuits and/or software enabling the ensuring the logic settling times, which influence the user program circuit state data response patterns generated, have substantially the same values under the single stepping test conditions as would have occurred if the test were performed, with the same user program circuit state data changes, in a single logic processing interval in continuous run mode at the clock frequency being tested.

21. The system as claimed in claim 20 wherein said monitoring computer includes circuits and/or software enabling the identifying of the location of failure in the user program circuit from the position of a bit that differs when the reference and response state data sets are compared, and indicating to the user the identified location in the user program circuit of each state data bit that fails to operate correctly.

22. The system as claimed in claim 20 wherein said circuits and/or software enabling the control of the delivered state data, and said circuits and/or software enabling the ensuring that the logic settling times, are provided at least in part by re-establishing the user program circuit state one step prior to the current state and then stepping the circuit two steps forward in two consecutive clock cycles to achieve a total advance of a single step while restricting the logic settling time to the settling time available between the two active clock transitions associated with the two steps forward.

23. The system as claimed in claim 20 wherein said circuits and/or software enabling the control of the state data delivered, and said circuits and/or software enabling the ensuring that the logic settling times, are provided at least in part by storing the previous state of at least some state data bits in flip-flops provided for that purpose, and by multiplexing the previous state data to the associated combinational logic inputs in the clock cycle prior to the single step cycle.

24. The system as claimed in claim 19, including:

software enabling the applying of input data, which defines stimulus patterns to the user program circuit, for the purpose of causing the user program circuit to respond as required to enable testing to detect incorrect logic settling, software enabling the recording of the user program circuit stimulus state data before, and user program circuit response state data after a logic processing interval active clock transition, as reference data indicative of correct user program circuit operation, by using sufficiently long logic settling times so that the circuit settles so as to meet necessary setup times and operate correctly, and software enabling the combination of said stimulus and response data with other stimulus and response data so as to build a set of data representing a desired test sequence and a known good reference set of stimulus and response patterns.

25. A system including a programmable device including:

at least one input interface and an input register for connection to the item under control to provide sampled and stored input data in digital form, at least one output interface and an output register for connection to the item under control to receive and store output data in digital form, programmable logic hardware including a plurality of basic logic elements and electrically configurable interconnections, said interconnections configurable to interconnect the logic elements as a user control program circuit and to connect the user control program circuit to said input and output interfaces, program loading circuits and/or software enabling the user to configure the programmable logic hardware with a user program circuit prior to commencing control, said user program circuit having a plurality of state data storage units storing the user program circuit state data, wherein said programmable device when configured contains a user program circuit interfaced to circuits and/or software, said circuits and/or software operating synchronously with the user program circuit , said circuits and/or software enabling the communication with a monitoring computer to respond to commands, said circuits and/or software enabling the operatation when commanded to cause the user program circuit to run, or pause, or single step, said circuits and/or software enabling the reading of data values from said state data storage units and to write data values to said state data storage units, said circuits and/or software enabling the pausing of the user program circuit in response to a signal originating in the user program circuit effective before the next active clock transition after that giving rise to the signal, said circuits and/or software enabling the configuration into the programmable logic hardware together with the user program circuit, and wherein said programmable device has an operating cycle of at least two non-overlapping sequential intervals, each interval consisting of one or more clock periods and during which, within a first said interval (the logic processing interval) an input data register operates to sample and store input data, and also the user program circuit operates to update its state data and allow the resultant combinational logic values to settle, and also an output data register operates to latch and store the output data, and within a second said interval (the data access interval) said circuits and/or software are enabled to read and write the user program circuit state data and cause control functions to be performed, and circuits and/or software enabling the detecting of transitions on selected signals within the user program circuit including:

circuits and/or software enabling selectively performing, for each selected signal, at least one of:

enabling or disabling the detection of transitions on the signal, reading the existing level of the signal, selecting the polarity of the transition to be detected, positive going, negative going or both, that will generate a trigger, and detecting whether a trigger condition has occurred during the last operational clock cycle; and circuits and/or software enabling the settings of the for detecting transitions, for each selected signal, to be changed by the monitoring computer during a data access interval while the user program circuit continues to operate multi-tasked; and a monitoring computer including:

circuits and/or software enabling the displaying of one or more user program circuit selected signal waveforms without polling a shift chain, for each waveform said circuits and/or software enabling the displaying being driven by transitions occurring on the signal, said waveform being defined by the initial waveform level and the cycle counts at which the transitions occur.

26. The system as claimed in claim 25 wherein the clock cycle counts at which the transitions occur, or their time equivalents, are also available for display.

27. The system as claimed in claim 26 wherein the programmable device provides clock count data of a kind and in a way that imposes no upper limit on the number of user program circuit enabled clock pulses for which the display may be produced.

28. A system including a programmable device including:

at least one input interface and an input register for connection to the item under control to provide sampled and stored input data in digital form, at least one output interface and an output register for connection to the item under control to receive and store output data in digital form, programmable logic hardware including a plurality of basic logic elements and electrically configurable interconnections, said interconnections configurable to interconnect the logic elements as a user control program circuit and to connect the user control program circuit to said input and output interfaces, program loading means enabling the user to configure the programmable logic hardware with a user program circuit prior to commencing control, said user program circuit having a plurality of state data storage units storing the user program circuit state data, wherein said programmable device when configured contains a user program circuit interfaced to circuits and/or software, said circuits and/or software enabling operating synchronously with the user program circuit, said circuits and/or software enabling the o communication with a monitoring computer to respond to commands, said circuits and/or software enabling operation when commanded to cause the user program circuit to run, or pause, or single step, said circuits and/or software enabling the reading of data values from said state data storage units and to write data values to said state data storage units, said circuits and/or software enabling the pausing of the user program circuit in response to a signal originating in the user program circuit effective before the next active clock transition after that giving rise to the signal, said circuits and/or software enabling the configuration into the programmable logic hardware together with the user program circuit, and wherein said programmable device has an operating cycle of at least two non-overlapping sequential intervals, each interval consisting of one or more clock periods and during which, within a first said interval (the logic processing interval) an input data register operates to sample and store input data, and also the user program circuit operates to update its state data and allow the resultant combinational logic values to settle, and also an output data register operates to latch and store the output data, and within a second said interval (the data access interval) said means of control is enabled to read and write the user program circuit state data and cause control functions to be performed; and a monitoring computer enabling the display of user program circuit signal waveforms and optionally other data, the monitoring computer including:

circuits and/or software enabling the reading of the user program circuit state data representing the signals and data to be displayed, circuits and/or software enabling the single stepping of the user program circuit, and circuits and/or software enabling the repeating of said reading and single stepping for the required number of clock cycles.

29. A computer programmed to generate a logic circuit for configuring into programmable logic hardware having a plurality of basic logic elements and electrically configurable interconnections, said circuit including a user program circuit having a plurality of state data storage units for storing user program state data, and a control circuit operating synchronously with the user program circuit, said control circuit being able to communicate with a monitoring computer to respond to commands, to operate when commanded to cause the user program circuit to run, or pause, or single step, and to read data values from said state data storage units and write data values to said state data storage units.

30. The computer as claimed in claim 29 wherein said control circuit is able to pause the user program circuit in response to a signal originating in the user program circuit effective before the next active clock transition.

31. The computer as claimed in claim 30 wherein said logic circuit has an operating cycle of at least two non-overlapping sequential intervals including a logic processing interval and a data access interval, each interval consisting of one or more clock periods, and within said logic processing interval an input data register operates to sample and store input data, and the user program circuit operates to update its state data and allow resultant combinational logic values to settle, and an output data register operates to latch and store the output data, and within said data access interval said control circuit is able to read and write the user program circuit state data and cause control functions to be performed.

32. The computer as claimed in claim 31 wherein said logic circuit includes circuits for detecting transitions on selected signals within the user program circuit including:

circuits for selectively performing, for each selected signal, at least one of:
enabling or disabling the detection of transitions on the signal,
reading the existing level of the signal,
selecting the polarity of the transition to be detected, positive going, negative going or both, that will generate a trigger, and
detecting whether a trigger condition has occurred during the last operational clock cycle; and circuits for allowing settings of the circuits for detecting transitions, for each selected signal, to be changed by the monitoring computer during a data access interval while the user program circuit continues to operate multi-tasked.

33. The computer as claimed in claim 32 wherein said logic circuit includes circuits enabling the user program circuit, when running, to be commanded to pause, after the occurrence of a selected transition on a selected user program circuit signal, prior to the next active clock transition.

34. The computer as claimed in claim 32 wherein said logic circuit includes circuits for enabling the user program circuit to be commanded to run totally within a single logic processing interval until the occurrence of a specified transition on a specified user program circuit signal.

35. The computer as claimed in claim 31 wherein said logic circuit includes circuits for, selectably, either single stepping with adequate time at each step to allow the user program circuit to fully settle, or single stepping with the settling time limited, independent of the duration between steps, to that available within a single active transition interval (ATI).

36. The computer as claimed in claim 31 wherein said logic circuit includes at least one of the following:

circuits for indicating to the user or to external circuits when said programmable device is in the logic processing interval,
circuits for saving the user program circuit state data into a backup memory when main power is lost, and restoring said state data when main power returns,
circuits for configuring the programmable logic hardware at power-on including with a user program circuit and other necessary circuits so as to automatically start operation and run the user program circuit,
circuits for setting the clock frequency automatically at power-on, and
circuits for communicating with the monitoring computer via a wired or wireless network capable of supporting communications to more than one device.

37. The computer as claimed in claim 29 programmed to also generate a version of the logic circuit that excludes said control circuit.

* * * * *